(12) United States Patent
Quattrini

(10) Patent No.: US 10,381,851 B2
(45) Date of Patent: Aug. 13, 2019

(54) BATTERY SUPPORT FOR A SCANNING DEVICE

(71) Applicant: Datalogic IP Tech S.r.l., Bologna (IT)

(72) Inventor: Paolo Quattrini, Sala Bolognese (IT)

(73) Assignee: Datalogic IP Tech S.R.L., Bologna (IT)

(*) Notice: Subject to any disclaimer, the term of this patent is extended or adjusted under 35 U.S.C. 154(b) by 0 days.

(21) Appl. No.: 15/851,756

(22) Filed: Dec. 22, 2017

(65) Prior Publication Data
US 2019/0199113 A1   Jun. 27, 2019

(51) Int. Cl.
| | |
|---|---|
| G06K 7/10 | (2006.01) |
| H02J 7/00 | (2006.01) |
| H02J 9/00 | (2006.01) |
| H04N 5/225 | (2006.01) |
| H04N 5/232 | (2006.01) |
| H05K 5/02 | (2006.01) |
| G02B 23/24 | (2006.01) |
| G06F 1/16 | (2006.01) |
| H04N 5/235 | (2006.01) |

(52) U.S. Cl.
CPC ........ *H02J 7/0047* (2013.01); *G02B 23/2484* (2013.01); *G06F 1/1626* (2013.01); *G06F 1/1635* (2013.01); *G06F 1/1654* (2013.01); *H02J 9/005* (2013.01); *H04N 5/2256* (2013.01); *H04N 5/2354* (2013.01); *H04N 5/23241* (2013.01); *H05K 5/023* (2013.01)

(58) Field of Classification Search
CPC .... H02J 7/0047; H02J 9/005; G02B 23/2484; G06F 1/1626; G06F 1/1635; G06F 1/1654; H04N 5/2256; H04N 5/23241; H04N 5/2354; H05K 5/023
USPC ............ 235/462.45, 462.47, 472.01, 462.44
See application file for complete search history.

(56) References Cited

U.S. PATENT DOCUMENTS

| | | |
|---|---|---|
| 5,410,141 A | 4/1995 | Koenck et al. |
| 5,598,082 A | 1/1997 | Gilpin et al. |

(Continued)

FOREIGN PATENT DOCUMENTS

EP   2952998 A1   12/2015

OTHER PUBLICATIONS

Int'l Search Report and Written Opinion from related PCT/EP2018/085990, dated May 3, 2019, 13 pages.

*Primary Examiner* — Karl D Frech
(74) *Attorney, Agent, or Firm* — The Juhasz Law Firm

(57) ABSTRACT

A battery support for a scanning device includes a separator plate and multiple elongate battery guides. The separator plate includes multiple mounting supports to engage mounting portions of the interior of the head portion to install the separator plate within the casing. The multiple elongate battery guides extend from the handle-side surface of the separator plate into the interior of the handle portion when the separator plate is installed within the casing. The multiple elongate battery guides engage a removable battery as the battery is inserted into a second end of the handle portion opposite a first end to guide a battery mating connector towards a scanner battery connector. The multiple battery guides continue to engage the removable battery while the battery connector engages the mating connector. The multiple battery guides are configured to prevent exertions of physical stress on the battery connector through the mating connector by the battery.

25 Claims, 11 Drawing Sheets

(56) References Cited

U.S. PATENT DOCUMENTS

| | | | |
|---|---|---|---|
| 7,867,019 B1 * | 1/2011 | Loukusa | G01J 5/02 |
| | | | 439/382 |
| 7,902,990 B2 | 3/2011 | Delmonico et al. | |
| 8,460,813 B2 * | 6/2013 | Lerner | H01M 2/1055 |
| | | | 429/123 |
| 9,436,226 B2 | 9/2016 | Chen | |
| 9,461,281 B2 * | 10/2016 | Wackwitz | B25F 5/00 |
| 9,780,580 B1 | 10/2017 | Dryzmala et al. | |

* cited by examiner

BATTERY SUPPORT FOR A SCANNING DEVICE

BACKGROUND OF THE INVENTION

1. Field of the Invention

The present invention relates to devices for wirelessly capturing encoded data and more specifically to a battery support for a scanning device.

2. Description of the Related Art

Scanning devices require a source of power to operate. The source of power may come from a battery or a wall outlet. The use of a battery enhances the portability of the scanning devices.

One difficulty with the use of a battery in a scanning device may arise during insertion of the battery into the scanning device. In order for the battery to function properly, the connector on the battery needs to properly connect with a power connector on the scanning device. However, precisely guiding the battery during insertion in order that the battery and scanning device connectors properly align and interconnect can be difficult and time consuming. An incorrect interconnection may lead to power disruption or if not properly connected no power at all.

Another difficulty with use of a battery may arise during use of the scanning device. The battery may be held in place inside the scanning device by the connection that is formed between the battery and the scanning device connector, as well as by circuitboards arranged about the battery.

During normal operation of a scanning device, the interconnection between the battery and the scanning device connectors may be adequate. However, where, for example, the scanning device is a handheld scanning device, when the handheld scanning device is dropped, knocked or simply banged around, the drop impacts can cause product damage including the movement of the battery inside the handheld scanning device and even disconnection of the battery from the handheld scanning device.

Thus, a system of supporting a battery in a scanning device is needed.

SUMMARY OF THE INVENTION

Technologies are described for optical barcode scanning devices, and in particular to a battery support for a scanning device.

In one aspect, a battery support may include a separator plate configured to separate an interior of a head portion of a casing of a scanning device from an interior of an elongate handle portion of the casing when installed within the casing at a location where a first end of the handle portion connects to the head portion. The separator plate may include multiple mounting supports carried by the separator plate to engage mounting portions of the interior of the head portion to install the separator plate within the casing. The battery support may include multiple elongate battery guides that extend from the handle-side surface of the separator plate and into the interior of the handle portion when the separator plate is installed within the casing. The multiple elongate battery guides may be configured to engage a removable battery as the removable battery is inserted into a second end of the handle portion opposite the first end to guide a mating connector carried by the removable battery towards a battery connector carried by the scanning device. The multiple battery guides may continue to engage the removable battery while the battery connector engages the mating connector, the multiple battery guides being configured to prevent exertions of physical stress on the battery connector through the mating connector by the removable battery.

In another aspect, a scanning device may include a casing including a head portion and a handle portion, wherein an interior of the handle portion may be configured to releasably retain a removable battery to provide electric power to the scanning device. An indicia scanning engine may be carried within an interior of the head portion to scan an indicia carried on a surface of a label. The scanning device may include a battery support including a separator plate configured to separate the interior of a head portion of the scanning device from an interior of the handle portion when installed within the casing at a location where a first end of the handle portion connects to the head portion. The scanning device may include multiple elongate battery guides that extend from a handle-side surface of the separator plate and into the interior of the handle portion when the separated plate is installed within the casing. The multiple elongate battery guides may engage a removable battery as the removable battery is inserted into a second end of the handle portion opposite the first end to guide a mating connector of the removable battery towards engagement with a battery connector of the scanning device within the interior of the handle portion. The multiple battery guides may continue to engage the removable battery while the battery connector engages the mating connector, the multiple battery guides configured to prevent exertions of physical stress on the battery connector through the mating connector by the removable battery.

DETAILED DESCRIPTION OF THE INVENTION

Figure 1:
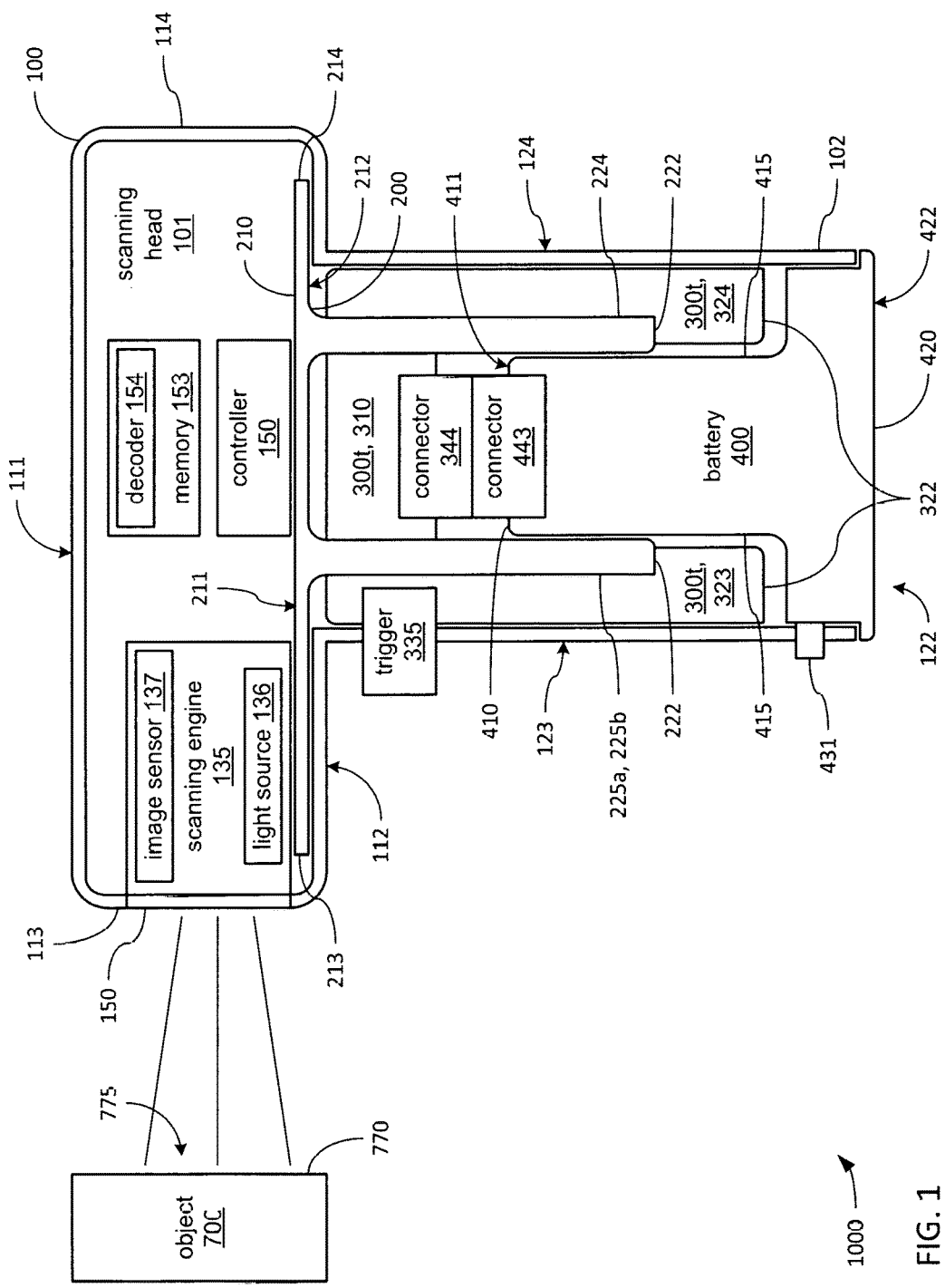
FIG. 1 shows aspects of a system of handheld scanning device components according to this disclosure.

In the following detailed description, reference is made to the accompanying drawings that form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Disclosed herein generally is a battery support including a separator plate configured to separate an interior of a head portion of a casing of a scanning device from an interior of an elongate handle portion of the casing when installed within the casing at a location where a first end of the handle portion connects to the head portion. The separator plate may include multiple mounting supports carried by the separator plate to engage mounting portions of the interior of the head portion to install the separator plate within the casing. The battery support may include multiple elongate battery guides that extend from the handle-side surface of the separator plate and into the interior of the handle portion when the separator plate is installed within the casing. The multiple elongate battery guides may be configured to engage a removable battery as the removable battery is inserted into a second end of the handle portion opposite the first end to guide a mating connector carried by the removable battery towards a battery connector carried by the scanning device. The multiple battery guides may continue to engage the removable battery while the battery connector engages the mating connector, the multiple battery guides being configured to prevent exertions of physical stress on the battery connector through the mating connector by the removable battery.

Referring to the FIGS., FIG. 1 shows aspects of a system 1000 of handheld scanning device components according to this disclosure. System 1000 comprises a handheld scanner device 100 and an object 700 to be scanned. The handheld scanner device 100 includes a scanning engine 135 and a decoder 154 mounted in a scanning head 101 of the handheld scanner device. The handheld scanning device 100 is capable of reading, that is, imaging and decoding indicia 775. The indicia may be any of a variety of forms of bar code or quick-response (QR) code, including and not limited to, one or more of Codabar; Code 25 (Interleaved); Code 25 (Non-interleaved); Code 11; Code 39; Code 93; Code 128; CPC Binary; DUN 14; EAN 2; EAN 5; EAN-8, EAN-13; Facing Identification Mark; GS1-128; GS1 DataBar; HIBC; Intelligent Mail barcode; ITF-14; JAN; KarTrak ACI; Latent image barcode; MSI; Pharmacode; PLANET; Plessey; Post-Bar; POSTNET; RM4SCC/KIX; Telepen; UPC; Aztec Code; Code 1; ColorCode; Color Construct Code; Cronto-Sign; CyberCode; d-touch; DataGlyphs; Data Matrix; Datastrip Code; digital paper; EZcode; Color; High Capacity Color Barcode; HueCode; InterCode; MaxiCode; MMCC; NexCode; Nintendo e-Reader; Dotcode; PDF417; QR code; ShotCode; and SPARQCode.

The indicia 775 appears on the object 700 which may be any of a variety of objects that may carry any of a variety of forms of the indicia 775, including and not limited to, a package carrying a shipping label that includes the indicia 775, or a product for sale within retail packaging on which the indicia 775 is printed as part of the graphical artwork thereof. The indicia 775 may encode data, including and not limited to, data indicating the addresses of the sender and intended recipient of a package, or data providing a universal product code (UPC) that uniquely identifies a product for sale.

The scanning engine 135 is adapted to capture image frames of a field of view FV of the handheld scanning device 100 and the decoder 154 is adapted to decode encoded indicia within a captured image frame. The scanning head 101 supports circuitry of the handheld scanning device 100 including the scanning engine 135 and the decoder 154 within an interior region of the scanning head 101.

The scanning head 101 forms a housing including a top wall 111, a bottom wall 112, a front end 113, and a rear end 114. These surfaces define a form factor for a housing of the scanning head 101. The form factor of the housing for the scanning head 101 is a matter of design choice. Scanning head 101 further comprises a window 150 formed of a transparent material through which a light source 136 transmits light that is reflected off surface 770 of the object 700 and captured by an image sensor 137 of the scanning engine 135 for decode by the handheld scanning device 100 as explained below.

The scanning engine 135 includes the image sensor 137 and associated circuitry. The image sensor 137, also referred to as the imaging camera assembly, is a device well component known in the art and typically includes a housing supporting focusing optics including one or more imaging lens and a photosensor or pixel array ("sensor array") (not shown).

The scanning engine 135 also includes the light source 136 and associated circuitry. The light source 136 may emit various forms of collimated and/or monochromatic light, including light that projects any of a variety of patterns onto the surface 770 of the object 700 that carries the indicia 775. As will be familiar to those skilled in the art, such emission of light is to provide sufficient illumination to ensure that the indicia 775 is sufficiently visible to be captured, and/or may provide a visible pattern of markers on the surface 770 of the object 700 and/or the indicia 775 as a guide to determining the orientation of the indicia 775 relative to the image sensor 137 in order to improve the accuracy with which the data encoded within the indicia 775 may be decoded.

Illustratively, the scanning light source 136 of the indicia scanning engine 135 comprises a collimated light emitter that emits collimated light along a central collimated light emission axis that extends parallel to the central scanning axis and central projection axis. The collimated light emitter emits the collimated light to illuminate at least a portion of the indicia 775 during scanning of the indicia.

The sensor array of the image sensor 137 is enabled during an exposure period to capture an image of the target indicia 775 within a field of view FV of the handheld scanning device 100. The field of view FV of the handheld scanning device 100 is a function of both the configuration of the sensor array and the optical characteristics of the imaging lens of the image sensor 137 and the distance and orientation between the array and the imaging lens. In one exemplary embodiment, the system 1000 is a linear or one dimensional imaging system and the sensor array is a linear or 1D sensor array. However, one of skill in the art would recognize that the system 1000 is also applicable to imaging systems utilizing a 2D photosensor array to image 2D bar codes, and other codes.

The handheld scanning device 100 includes a handle 102 adapted to be grasped by an operator's hand and adapted to the scanning head 101. The handle 102 has a front surface 123, a rear surface 124, and a lower end 122. The lower end 122 of the handle 102 is adapted to be received in a docking station (not shown) positioned on a substrate such as a table or sales counter.

The scanning head 101 supports the scanning engine 135 within an interior region of the scanning head 101. The scanning head 101 is generally rectangular in shape and defines a horizontal axis H and a vertical axis V. The vertical axis V is generally aligned with the gripping portion of the handle 102.

The scanning device 100 is adapted to be used in both a hand-held mode and a fixed position mode. In the fixed position mode, the scanning device 100 is received in the docking station and a target object 700 having a target indicia 775 is brought within the field of view FV of the handheld scanning device 100 scanning engine 135 in order to have the scanning device 100 read the target indicia 775. The scanning device is typically always on or operational in the fixed position mode to image and decode any target indicia 775 presented to the handheld scanning device 100 within the field of view FV. The docking station is plugged into an AC power source and provides regulated DC power to circuitry of the handheld scanning device 100. Thus, when the handheld scanning device 100 is in the docking station power is available to keep the first system 1000 on continuously.

In a hand-held mode, the scanning device 100 is removed from the docking station so the scanning device 100 can be carried by an operator and positioned such that the target indicia 775 is within the field of view FV of the handheld scanning device 100. In the hand-held mode, imaging and decoding of the target indicia 775 is instituted by the operator depressing a trigger switch 335 (also referred to as "trigger button") on a circuit board 300t, illustratively having a U shape, extending through an opening near the upper part of the gripping portion of the handle 102.

The scanning head 101 and the handle 102 of the casing of the handheld scanning device 100 cooperate to give the casing a gun-like shape to enable the scanning device to be used to scan the target indicia 775 carried on the surface 770 of an object 770 (e.g., a label) by pointing the scanning device in a gun-like manner at the label and depressing the trigger button of the handheld scanning device 100. As previously indicated, the circuit board 300t carries the trigger button 335 at a location that makes the trigger button accessible through an opening formed through a portion of the handle portion 102.

The scanning engine 135 operates under the control of a controller 150 (also referred to herein as "processor 150"). Controller 150 may include any of a wide variety of processors, microcontrollers, gate-array logic devices, etc. that may be incorporate any of a variety of features to enhance speed and/or efficiency of processing operations. Such features may include and are not limited to, multi-threading support, multiple processing cores, single-instruction multiple-data (SIMD) support, directly integrated memory control functionality, and/or various modes of operation by which speed of throughput and/or level of power consumption may be dynamically altered.

When removed from the docking station, power is supplied to the handheld scanning device 100 by a battery 400 (also referred to herein as "power source"). Battery 400 may be based on any of a wide variety of energy storage technologies to provide energy storage that enables recharging, including and not limited to, nickel-cadmium (NiCd), nickel-metal hydride (NiMH), lithium-ion and/or lithium-polymer.

The scanning engine 135 and the decoder 154 of the present disclosure may be embodied in hardware, software, electrical circuitry, firmware embedded within the controller 150 or the scanning engine 135, on flash read only memory (ROM), on an application specific integrated circuit (ASIC), or any combination thereof.

As previously explained, the scanning engine 135 includes the scanning light source 136 and associated circuitry to illuminate the target indicia 775. Scanning light source 136 projects collimated and/or monochromatic light along an axis to, for example, paint a surface/label 770 of object 700 carrying target indicia 775.

As is known in the art, the scanning light source 136 is typically provided with an aperture (not shown) illustratively having a generally rectangular opening for defining an illumination field of view. The scanning light source 136 may include one or more LEDs. The scanning light source 136 can also be other kinds of light source, such as, a cold cathode lamp (CFL). The scanning light source 136 may also include an illumination lens (not shown) disposed between the scanning light source 136 and the aperture. The illumination lens directs the illumination from the scanning light source 136 through the aperture to generate an illumination pattern IP that fills or substantially coincides with the field of view FV of the handheld scanning system. In an exemplary embodiment, the illumination pattern IP and field of view FV are generally rectangular in shape.

Scanning head 101 may also include an aiming system (not shown) which generates a visible aiming pattern to aid the operator in aiming the handheld scanning device 100 at the imaging and decoding target indicia 775 when using the handheld scanning device 100 in the hand-held mode. The aiming system generates a visible aiming pattern comprising a single dot of illumination, a plurality of dots and/or lines of illumination or overlapping groups of dots/lines of illumination, or other patterns. The aiming system typically includes a laser diode, a focusing lens and a pattern generator for generating the desired aiming pattern. Aiming systems are well known to one skilled in the art and a matter of design choice.

The image sensor 137 and scanning light source 136 are supported within a support structure in proximity to the window 150 which forms a portion of a front end 113 of the scanning head 101. The window 150 is oriented such that its horizontal axis is substantially parallel to the scanning head 101 horizontal axis H and its vertical axis is substantially parallel to the scanning head 101 vertical axis V. Reflected light from the target indicia 775 passes through the transparent window 150 of the scanning head 101, is received by the image sensor 137 and focused onto the imaging system sensor array therein.

As previously explained, the image sensor 137 includes a photosensor or pixel array. The image sensor 137 may include any of a variety of light sensing components to effect the capture of an image of the indicia, including and not limited to, a charge-coupled device (CCD) providing a single row of individual light sensors operated in a manner that sweeps over the indicia to scan it, or a CCD providing a two-dimensional (2D) array of individual light sensors to capture a 2D image of the image sensor 320 in a manner akin to a camera.

In one illustrative embodiment, the sensor array comprises a charged coupled device (CCD), a complementary metal oxide semiconductor (CMOS), or other imaging pixel array, operating under the control of the circuitry associated with the image sensor. In one exemplary embodiment, the sensor array comprises a linear pixel CCD or CMOS array with a one row of pixels.

The digitized gray scale values of the digitized signal generated by the image sensor 137 are stored in the memory unit 153. The digital values corresponding to a read out of the pixel array of the image sensor 137 constitute an image frame, which is representative of the image projected by the focusing lens of the image sensor 136 onto the pixel array during an exposure period. The memory unit 153 may be a volatile storage and/or a non-volatile storage.

The memory unit 153 may be based on any of a variety of storage technologies that provide relatively high speeds of access, but which require the continuous provision of electric power to retain any data and/or routines stored therein. Such technologies may include, and are not limited to, random-access memory (RAM), dynamic RAM (DRAM), Double-Data-Rate DRAM (DDR-DRAM), synchronous DRAM (SDRAM), static RAM (SRAM), etc. The non-volatile storage 153 may be based on any of a variety of storage technologies that may not be capable of providing such relatively high speeds of access, but which may be capable of storing with greater density, and capable of retaining data and/or routines stored therein regardless of whether electric power is continuously provided. Such technologies include, and are not limited to, read-only memory (ROM), erasable programmable ROM (EPROM), electrically erasable programmable ROM (EEPROM), flash memory, magnetic or optical cards, one or more individual ferromagnetic disk drives, or a plurality of storage devices organized into one or more arrays (e.g., multiple ferromagnetic disk drives organized into a Redundant Array of Independent Disks array, or RAID array).

The decoder 154 operates on the digitized gray scale values of the image frame and attempts to decode any decodable image within the image frame, e.g., the imaged target indicia 775. If the decoding is successful, decoded data, representative of the data/information coded in the indicia 775 may be output via a data output port (not shown) and/or displayed to a user of the handheld scanning device via a display (not shown). Upon achieving a good "read" of the indicia 775, that is, the indicia 775 was successfully imaged and decoded, a speaker (not shown) and/or an indicator LED (not shown) may be activated by the handheld scanning device. Alternatively, a "Green Spot" may be generated on target indicia 775 by an optical hardware coupled to and controlled by the controller 150 according to the teachings of Applicant's Green Spot technology. The beep, indicator LED, and "Green Spot" all provide feedback to the user that the target indicia 775 has been successfully read, that is, the target indicia 775 has been successfully imaged and the imaged indicia 775 has been successfully decoded. If decoding is unsuccessful, a successive image frame captured by the image sensor 137 is selected and the decoding process is repeated until a successful decode is achieved.

Still referring to FIG. 1, battery 400 provides power to circuitry of scanning device 100 (e.g., controller 150 and scanning engine 135) via a connector 443 carried on an upper end 411 of an upper portion 410 of the battery 400. More specifically, the connector 443 (also referred to herein as "mating connector") carried on the upper end 411 of the upper portion 410 of the battery 400 electrically connects with a connector 344 (also referred to herein as "battery connector") carried by an upper portion 310 of a U-shaped circuitboard 300t as depicted in FIG. 4. U-shaped circuitboard 300t is connected to circuitry of the scanning device 100 (e.g., controller 150 and scanning engine 135). In this way, charge from battery 400 passes through connectors 443, 344 to deliver power to the handheld scanning device 100.

Referring to FIGS. 1 and 4, U-shaped circuitboard 300t also carries the trigger switch 335. As previously explained, the trigger switch 335 extends through the opening near the upper part of the gripping portion of the handle 102. In the hand-held mode, imaging and decoding of the target indicia 775 is instituted by the operator depressing the trigger switch 335.

Figure 4A:
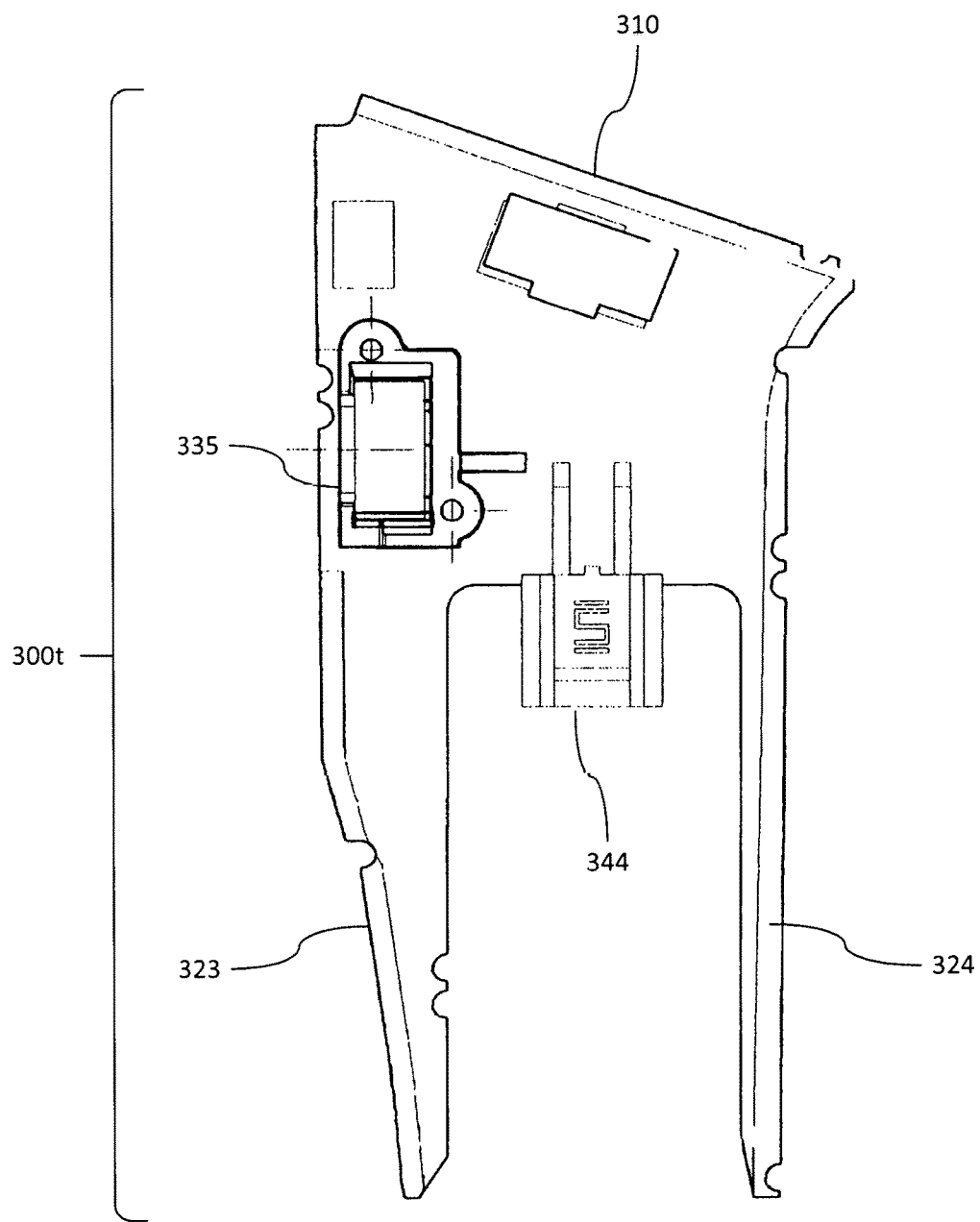
FIGS. 4A, 4B, and 4C, collectively referred to herein as FIG. 4, depict aspects of a circuitboard 300*t* of this disclosure.
Figure 4B:
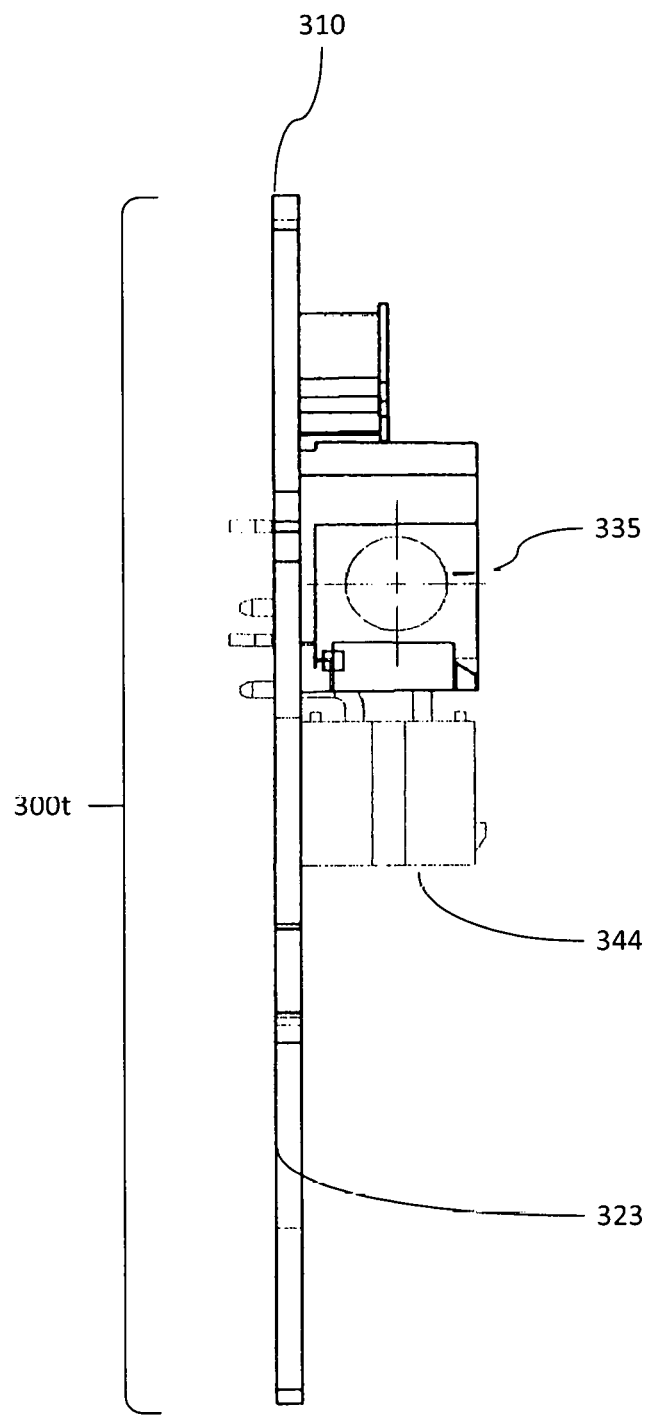
Figure 4C:
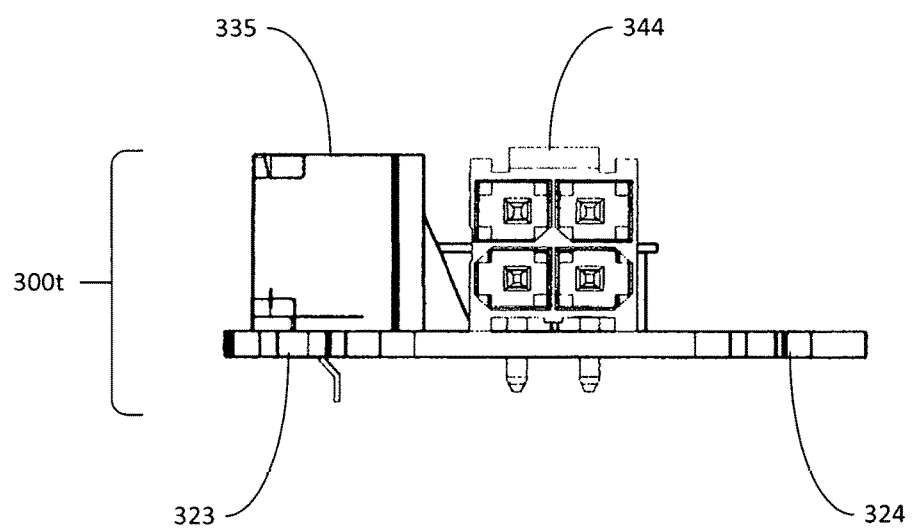
Figure 5:
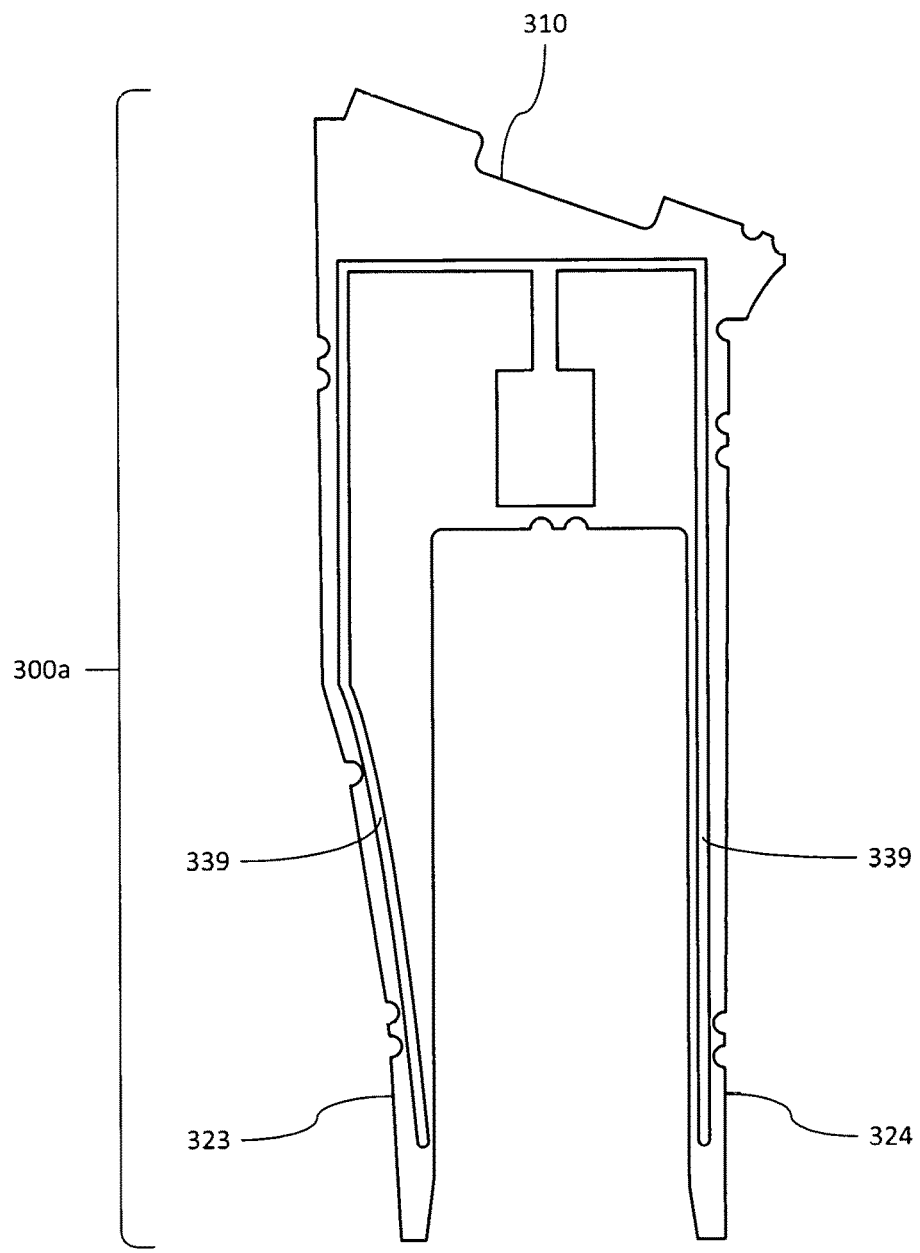
FIG. 5 depicts aspects of a circuitboard 300*a* of this disclosure.

As shown in FIG. 5, handheld scanning device 100 further comprises a U-shaped circuitboard 300a which is in generally alignment with U-shaped circuitboard 300t when inserted into the handheld scanning device 100. The lower portions 323 and 324 of the circuitboard 300a includes at least one conductor that forms an antenna 339 for radio frequency (RF) communications. The antenna 339 is formed as a set of conductive traces on circuitboard 300a as depicted in FIG. 5. Conductive traces on circuitboard 300a may also extend across upper portion 310 of the U-shaped circuitboard 300a to form a slot antenna configuration. The scanning device includes a transmitter circuit (not shown) which may also be carried by the circuitboard 300a (FIG. 4). The transmitter may be configured to transmit data encoded in the indicia 775 after scanning and interpretation of the indicia 775 to decode the encoded data.

Figure 2A:
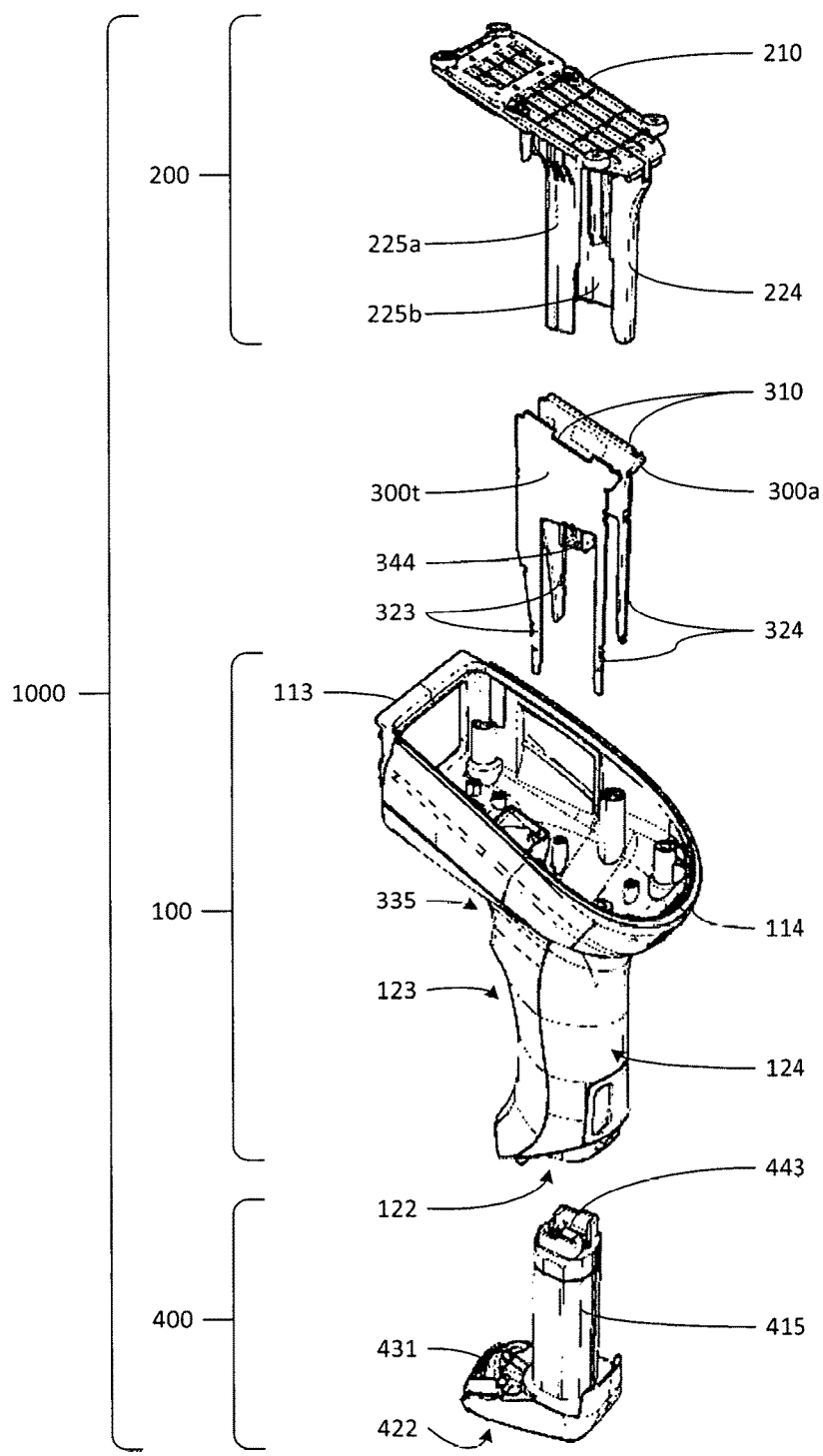
FIGS. 2A, 2B, 2C, and 2D, collectively referred to herein as FIG. 2, show in FIG. 2A a disassembled view of the handheld scanning device of FIG. 1; and in FIGS. 2B-2D a perspective, a side, and a front view, respectively, of a support structure 200 of this disclosure.

As depicted in FIGS. 2A and 4, the U-shaped circuitboard 300t also has an upper portion 310 and lower portions 323 and 324. The lower portions 323 and 324 extend downward toward the battery 400 when the handheld scanning device 100 is assembled.

FIG. 1 depicts handheld scanning device 100 further including a support structure 200 of this disclosure. FIG. 2 depicts the support structure in greater detail. As shown in FIGS. 2C and 2D, support structure 200 comprises an upper portion 210, circuitboard supports 221, and lower portions 224, 225a, and 225b.

Referring to FIG. 1, the upper portion 210 (also referred to herein as "separator plate") comprises a top surface 211, a bottom surface 212, the front end 213, and a rear end 214. As shown well in FIG. 2B, the upper portion 210 further carries eyelets 215 (also referred to herein as "mounting supports") by which the support structure 200 may be affixed to an inner surface of the bottom wall 112 of the scanning head 101 (see FIG. 1). The multiple eyelets may be illustratively positioned about a periphery of the separator plate and configured to cooperate with multiple fasteners (not shown) along an inner surface of the bottom wall 112 of the scanning head 101 of the handheld scanning device 100 to engage mounting portions (not shown) of the interior of the head portion of the scanning head 101 to install the separator plate 210 within the casing of the scanning device 100. In this way, the multiple mounting supports 215 carried by the separator plate 210 engage mounting portions of the interior of the head portion of the scanning device 210 to install the separator plate 210 within the casing of the scanning device 100.

The upper portion 210 (i.e., "separator plate") may also be configured to separate an interior of the scanning head 101 (also referred to herein as "head portion") of the casing of the scanning device 100 from an interior of the elongate handle portion 102 of the casing when installed within the casing at a location where a first end of the handle portion 102 connects to the head portion 101. The upper portion 210 (i.e., "separator plate") supports controller 150 and scanning engine 135 in their positions within the scanning head 101 of the handheld scanning device 100.

As previously explained, the scanning head 101 of the casing of the handheld scanning device 100 includes the scanning window 150 formed of transparent material through which the indicia scanning engine 135 of the scanning device 100 optically scans the indicia 775 carried on the surface 770 of the object 700, such as a label, that is external to the casing of the scanning device 100. A head-side surface (i.e., top surface 211) of the separator plate 210 (i.e., upper portion 210) that is opposite the handle-side surface (i.e., the bottom surface 212) of the separator plate (i.e., upper portion 210), and that faces into the interior of the head portion 101 of the casing of the handheld scanning device 100 when the separator plate (i.e., upper portion 210) is installed, is configured to engage and cooperate with a support (not shown) for the scanning engine 135 to mount the indicia scanning engine 135 at a fixed location within the interior of the head portion 101 of the handheld scanning device 100 and in an orientation that enables the indicia scanning engine 135 to optically scan the indicia through the scanning window 150.

Figure 2B:
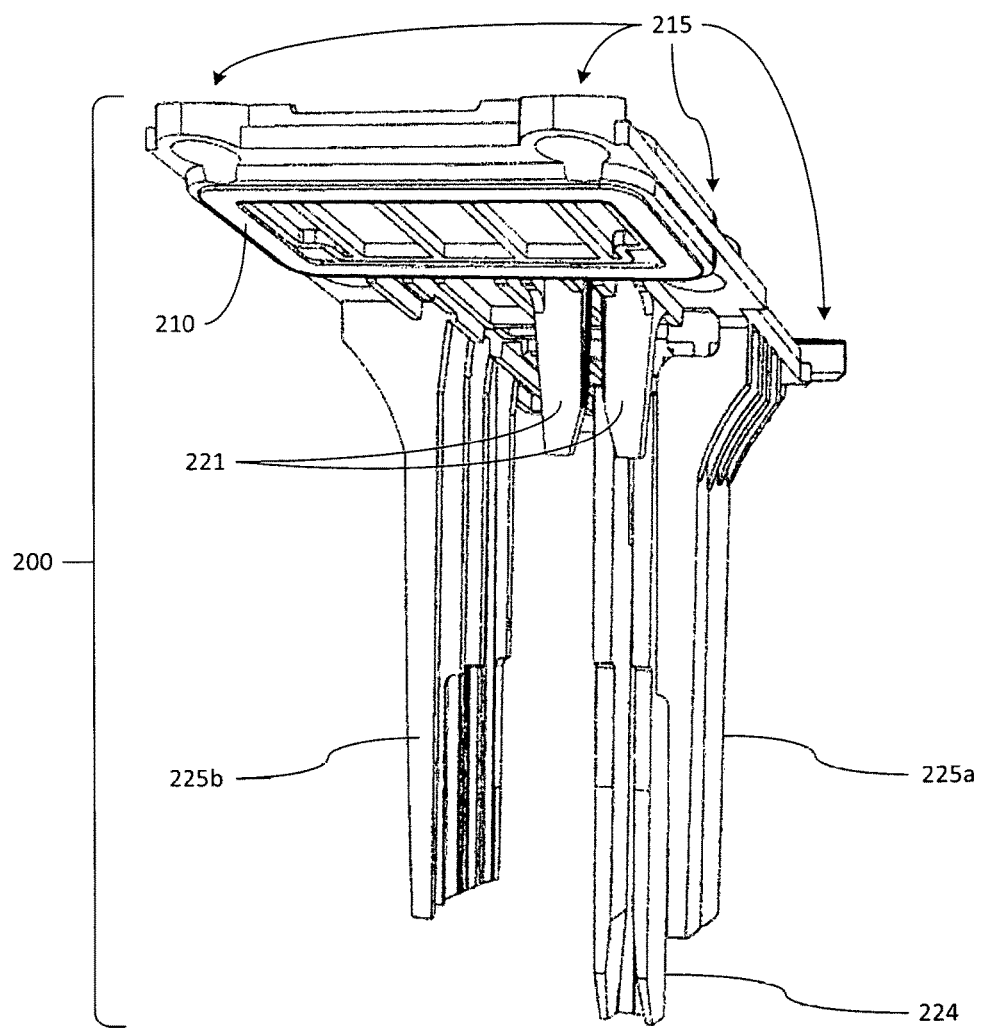
Figure 2C:
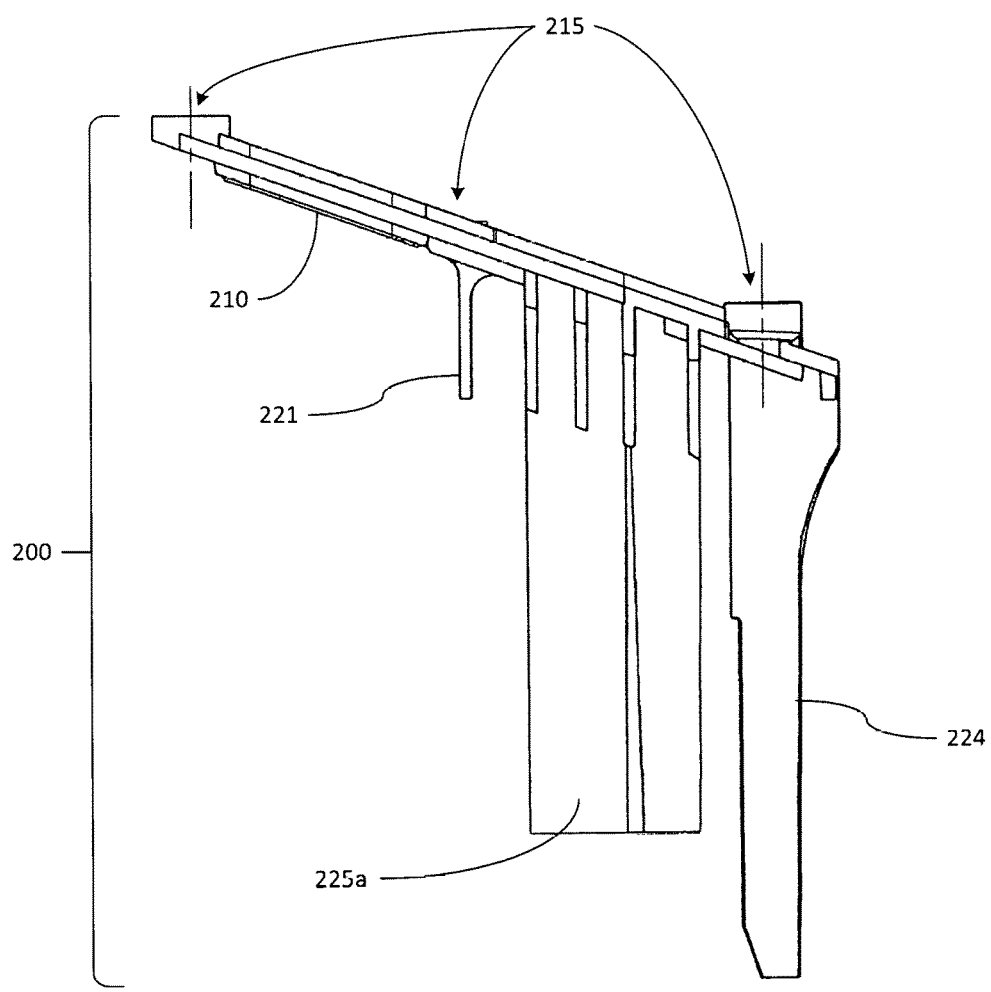
Figure 2D:
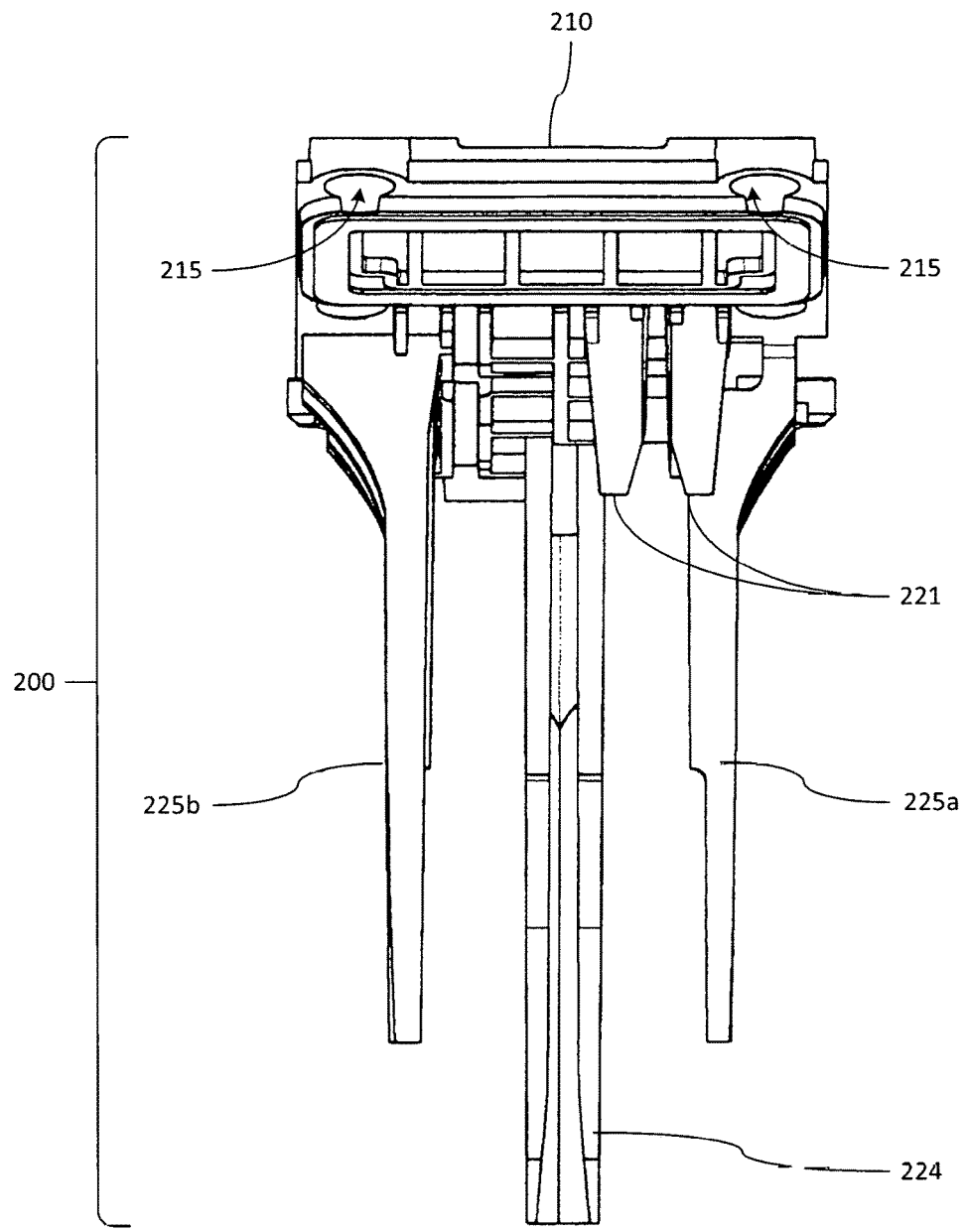

Referring k to FIGS. 2B and 2C in connection with FIG. 1, the separator plate 210 may further include circuit board supports 211 that extend from a handle-side surface of the separator plate (i.e., upper portion 210) and into the interior of the handle portion 102, when the separator plate (i.e., upper portion 210) is installed within the casing of the handheld scanning device 100, to physically support circuitboard 300t that carries the battery connector 344 to engage the mating connector 443 carried by the removable battery 400 when the removable battery is fully inserted into the handle portion of the casing of the scanning device 100.

Both circuitboards 300a and 300t (FIGS. 2A, 4 and 5) may be aligned against circuit board supports 211 and extend parallel to each other within handle 102 of the scanning device. Both circuitboards 300a and 300t include the upper portion 310 and lower portions 323, 324. When inserted into the handheld scanning device 100, the lower portions 323 and 324 of circuitboards 300a and 300t extend downward from upper portion 310 throughout much of the length of the handle 102, and both in front of and behind the upper portion 410 of battery 400 (see FIGS. 1 and 2A).

Turning now to FIG. 2D together with FIG. 1, lower portions 224, 225a and 225b (also referred to herein as "multiple elongate battery guides") extend from the handle-side surface (i.e., bottom side surface 212) of the separator plate (i.e., the upper portion 210) and into the interior of the handle portion 102 of the handheld scanning device 100 when the separator plate 210 is installed within the casing of the handheld scanning device 100. The multiple elongate battery guides 210 engage the removable battery 400 as the removable battery is inserted into a second end of the handle portion (i.e., the lower end 122) opposite a first end to guide the mating connector 443 carried by the battery 400 towards the battery connector 334 carried by the circuitboard 300t. The multiple battery guides (i.e., lower portions 224, 225a and 225b) continue to engage the removable battery 400 while the battery connector 334 engages the mating connector 442.

In extending downward from the upper portion 210, the multiple battery guides (i.e., lower portions 224, 225a, and 225b) support substantially cylindrical side 415 of upper portion 410 of battery 400 (see FIGS. 1 and 6) when the battery 400 is fully inserted into the handle 102 of the scanning device 100 (see FIG. 1). In so supporting the battery 400, the multiple battery guides (i.e., lower portions 224, 225a, and 225b) prevent exertions of physical stress on the battery connector 344 carried by circuitboard 300t through the mating connector 443 carried by the removable battery.

In one illustrative example, the multiple elongate battery guides (i.e., lower portions 224, 225a and 225b) of this disclosure include at least three elongate battery guides that surround and engage side portions of the removable battery at locations between the connector end and the retaining end. Alternatively, the multiple elongate battery guides may include any number of elongate battery guides sufficient to provide the function of aligning of the mating connector 443 carried by the battery 400 and the battery connector 344 carried by the circuitboard 300t and the function of supporting the battery 400 as taught by this disclosure.

Referring back to FIGS. 1 and 2, typically, the handle portion 102 of the handheld scanning device 100 has a flared shape wherein a second end is of a smaller cross-section than a first end, and the handle portion 102 tapers along its length from the larger cross-section of the first end to the smaller cross-section of the second end. Similarly, each of the multiple elongate battery guides (i.e., lower portions 224, 225a and 225b) may taper along its length from a larger cross section where each is connected to the handle-side of the separator plate (i.e. the bottom surface 212 of the separator plate (i.e., upper portion 210)) to a smaller cross section as each extends into the interior of the handle portion 102 of the scanning device 100.

The tapered shape of each of the multiple elongate battery guides (i.e., lower portions 224, 225a and 225b) cooperates with the flared shape of the handle portion 101 to enable assembly of the handheld scanning device 100 to include: supporting the circuitboards 300a, 300t by the circuit board supports 221 of the separator plate (i.e. upper portion 210) to position the battery connector 443 and the trigger button 335 carried by the circuitboard 300t at predetermined locations relative to the handle-side (i.e., bottom surface) of the separator plate (i.e. support structure 200); inserting the multiple elongate battery guides (i.e., lower portions 224, 225a and 225b) into the interior of the handle portion 102 through the first end of the handle portion 102 with the circuitboards 300t, 300a supported by the circuit board supports 221 to position the trigger button 335 to be accessible through the opening on the handle 102 of the scanning device 102 and to position the battery connector 443 carried by the battery 400 to be engaged by the mating connector 344 carried by the circuitboard 300t when the removable battery 400 is inserted into the interior of the handle portion 102 of the handheld scanning device 100; and positioning the multiple mounting supports (i.e., lower portions 224, 225a and 225b) of the separator plate (i.e. upper portion 210) in engagement with the mounting portions of the interior of the head portion 101 to install the separator plate (i.e. upper portion 210) within the casing of the scanning device 100.

Referring now to the functioning of the support structure 200 of this disclosure, the circuit board supports 221 (FIGS. 1 and 2) include at least one elongate portion that extends away from the separator plate (i.e. upper portion 210) and the battery connector 344 carried by circuitboard 300t and into interior of the handle portion 102 of the handheld scanning device 100 to engage a side portion of the removable battery 400. As the connector end (i.e., upper portion 410) of the removable battery 400 is inserted into the second end of the handle portion 102 of the casing of the handheld scanning device 100 during insertion of the removable battery 400 into the handle portion 102 to provide electric power to the scanning device, the connector end of the battery 400 (i.e., upper portion 410) is initially engaged by the at least one elongate portion of the circuit board supports 221 to guide the connector end (i.e., upper portion 410) toward engagement with the multiple elongate battery guides (i.e., lower portions 224, 225a and 225b). As the connector end (i.e., upper portion 410) of the removable battery 400 is further inserted into the interior of the handle portion 102, the connector end is subsequently engaged by the multiple battery guides (i.e., lower portions 224, 225a, and 225b) to guide the mating connector 443 carried by the connector end of the battery 400 toward engagement with the battery connector 344 carried by circuitboard 300t.

Thus, the mating connector 443 at the connector end (i.e., upper portion 410) of the removable battery 400 engages the battery connector 344 carried by the circuitboard 300t. Additionally, a portion of each of the multiple elongate battery guides (i.e., lower portions 224, 225a, and 225b) engages a portion of the connector end (i.e., upper portion 410) of the battery. Further, as shown in FIGS. 1 and 6, a mating mechanism 431 at the retaining end of the battery 400 engages a retaining mechanism (not shown) at the second end of the handle portion to releasably retain at least a portion of the removable battery within the handle portion.

Figure 6:
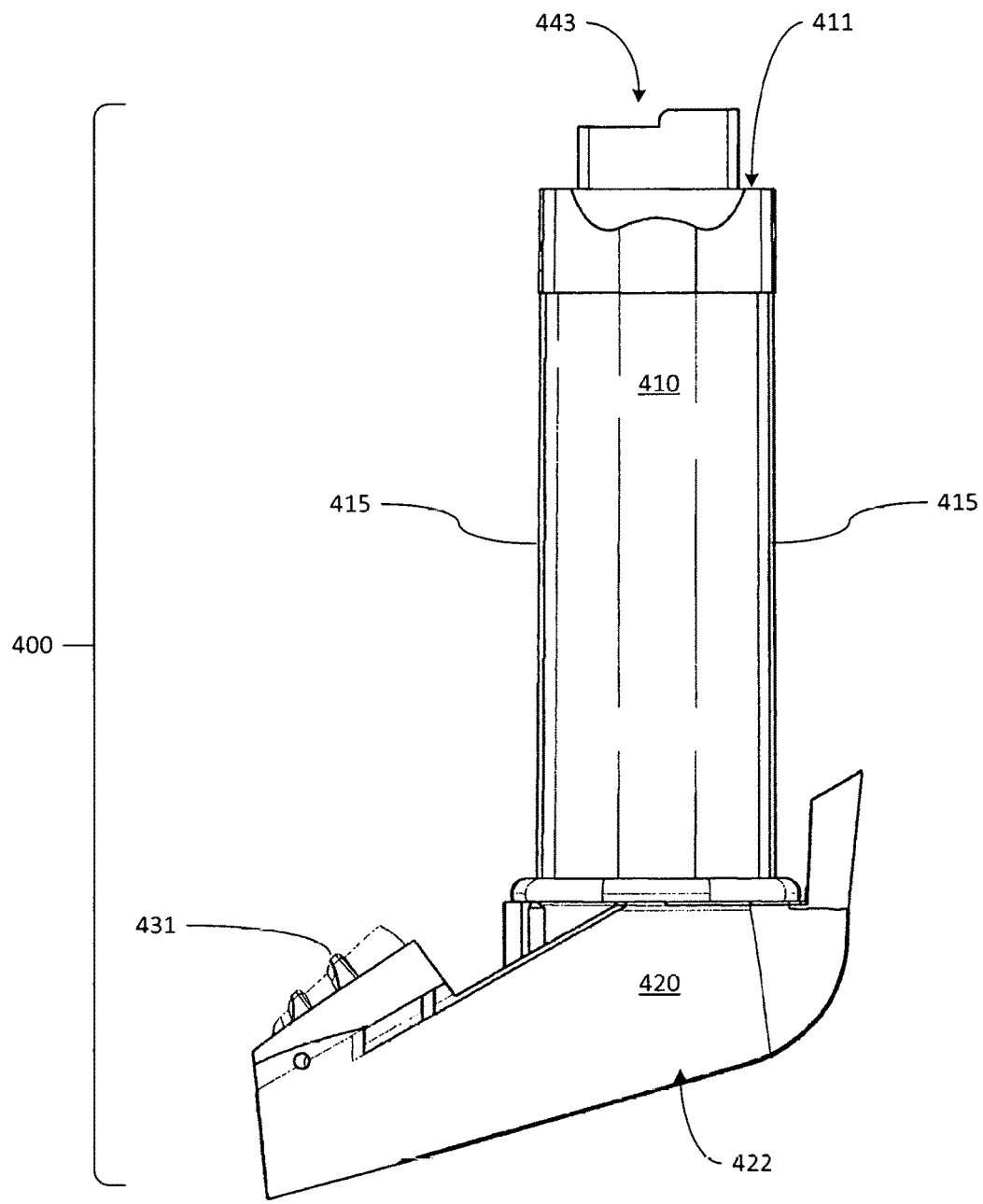
FIG. 6 depicts aspects of a battery 400 depicted in FIG. 1.

As shown in FIG. 6, the removable battery 400 may have an elongate shape that defines a connector end (i.e., the upper end 411) that carries the mating connector 443 (i.e., the battery connector) and a retaining end (i.e., the lower end 422) that carries the mating mechanism 431.

Referring to FIGS. 1 and 6, with the removable battery 400 retained within the interior of the handle portion 102, at least a portion of the retaining end (i.e., lower end 422) of the removable battery may close the second end of the handle portion 102 and becomes part of the exterior of the casing of the scanning device 100.

In addition, with the removable battery 400 retained within the interior of the handle portion 102 by cooperation of the retaining mechanism (not shown) and the mating mechanism 431, the removable battery 400 is physically supported within the interior of the handle portion 102 at the retaining end (i.e., lower end 422) of the removable battery 400 by the engagement between the retaining mechanism and the mating mechanism, and at the connector end (i.e., upper portion 410) of the removable battery 400 by the multiple elongate battery guides (i.e., lower portions 224, 225a, and 225b), to prevent damage to the battery connector 344 carried by the circuitboard 300t and the mating connector carried by the battery 400 by preventing transmission of physical forces caused by a dropping of the scanning device 100 onto a hard surface through the engagement the battery connector 344 and the mating connector 443.

Referring now to FIGS. 1 and 2 to the assembly of the handheld scanning device, when the upper end 411 of the battery 400 is inserted through an opening formed in the lower end 122 of the handle 102, the upper end 411 of the battery 400 first encounters and is first guided towards power connector 344 carried by the circuitboard 300t by lower portions 323 and 324 of circuitboards 300a and 300t (see FIG. 2A).

As more of the upper portion 410 of battery 400 is inserted, upper end 411 of battery 400 then encounters and is next guided towards power connector 344 carried by the circuitboard 300t by the multiple elongate battery guides (i.e., lower portions 224, 225a and 225b) of support structure 200 of this disclosure (see FIGS. 1 and 2).

The multiple elongate battery guides (i.e., lower portions 224, 225a and 225b) of support structure 200 continue to engage (see FIG. 2) substantially cylindrical side wall 415 of upper portion 410 of battery (see FIGS. 2A and 6) to continue to guide power connector 443 of the battery 400 towards engagement with the power connector 344 carried by the circuitboard 300t (see FIGS. 1 and 2).

This engagement between side wall 415 of upper portion 410 of battery and the multiple elongate battery guides (i.e., lower portions 224, 225a and 225b) of support structure 200 provides the physical support of the upper portion 410 of the battery 400 within the handle 102 of the scanning device.

Figure 3:
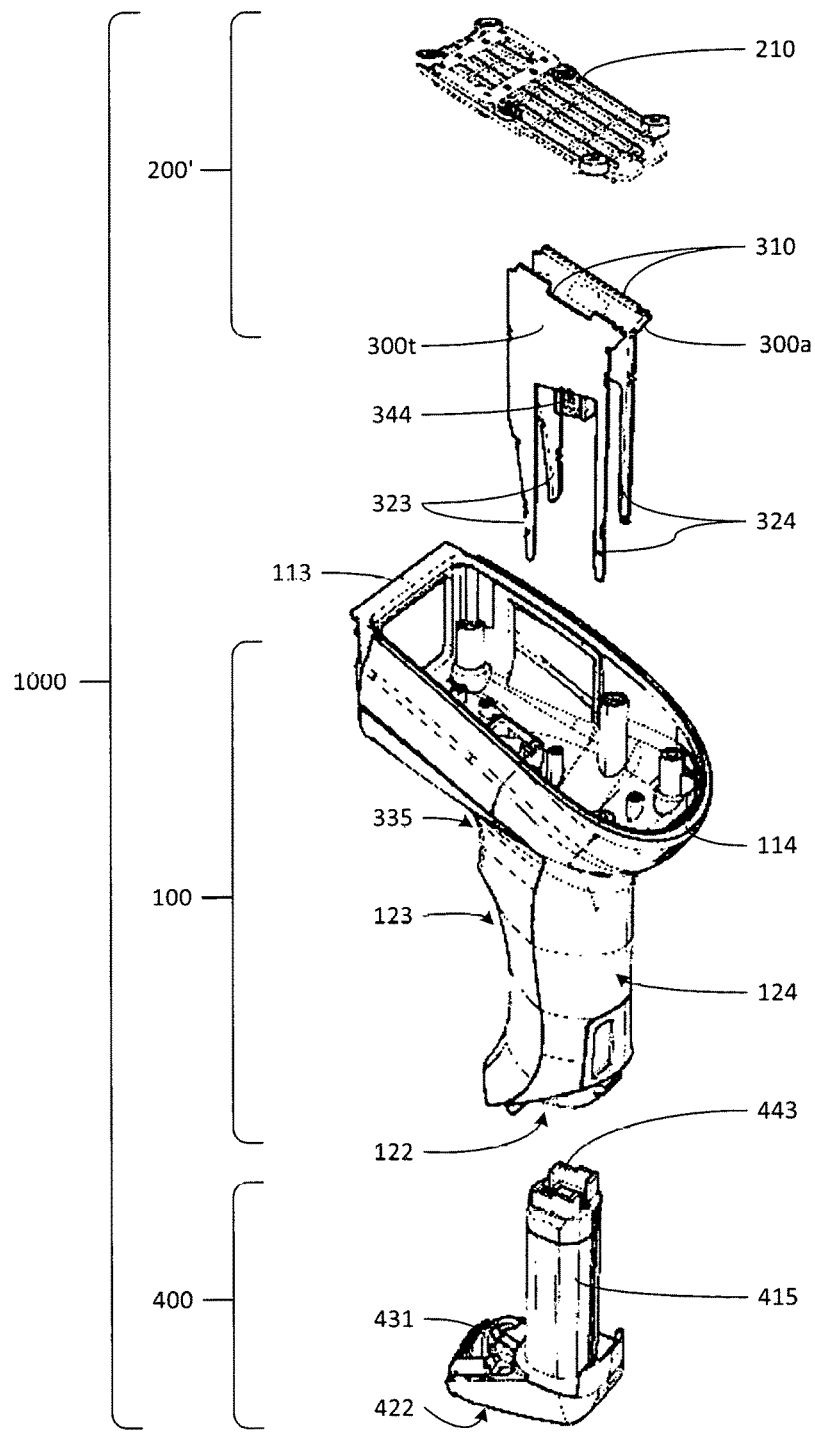
FIG. 3 depicts a disassembled view of a prior art handheld scanning device of Applicant.

The advantages of the support structure 200 of this disclosure over prior art is explained with reference to FIG. 3. FIG. 3 depicts a disassembled view of a support structure of a prior handheld scanner of Applicant. Except for support structure 200, the components in FIG. 3 bearing the same number as the components in FIG. 2 perform the same function and operate in the same manner when battery 400 is inserted into the handheld scanning device 100. The difference between the teachings of this disclosure and that in the prior handheld scanner of Applicant lies in the support structure 200. In the FIG. 3 prior art embodiment, the prior art support structure 200 only has the upper portion 210 (i.e., the separator plate). As previously explained, upper portion 210 carries eyelets 215 by which support structure 200 may be affixed to an inner surface of the bottom wall 112 of the scanning head 101. The upper portion 210 (i.e., the separator plate) supports the controller 150 and the scanning engine 135 in their positions within the scanning head 101 of the handheld scanning device 100.

Importantly, the prior art support structure 200 is without the circuitboard supports 221 and the multiple elongate battery guides (i.e., lower portions 224, 225a and 225b) of this disclosure. As explained in connection with FIG. 2 in connection with the support structure 200 of this disclosure, the circuitboard supports 221 of this disclosure extend downward from the bottom surface 212 of the upper portion 210 (i.e., the separator plate) to support the upper portion 310 of circuitboards 300a and 300t in the assembled scanning device 100 as taught by this disclosure.

In addition, the multiple elongate battery guides (i.e., lower portions 224, 225a and 225b) of this disclosure extend down from the bottom surface 212 of the upper portion 210 (i.e., the separator plate) to support substantially cylindrical wall 415 of the upper portion 410 of the battery 400 when the battery is fully inserted into the handle 102 (see FIGS. 1, 2 and 6).

In use, at the start of the battery insertion process, when the upper end 411 of the battery 400 is inserted through an opening formed in the lower end 122 of the handle 102, in both FIG. 2 of this disclosure and FIG. 3 of the prior, the upper portion 410 of the battery 400 first encounters and is first guided towards the power connector 344 carried by the circuitboard 300t by the lower ends of the lower portions 323 and 324 of the circuitboards 300a and 300t (see FIGS. 2 and 4).

However, as more of the upper portion 410 of the battery 400 is inserted, in FIG. 2 of this disclosure, the upper end 411 of the battery 400 then encounters and is next guided towards the power connector 344 carried by the circuitboard 300t by lower ends of the multiple elongate battery guides (i.e., lower portions 224, 225a and 225b) of the support structure 200 of this disclosure (see FIG. 2). This is not possible with the prior art support structure 200 of prior art FIG. 3 since the support structure 200 of FIG. 3 has no multiple elongate battery guides (i.e., lower portions 224, 225a and 225b) to encounter and guide the battery 400 toward the power connector 344 carried by the circuitboard 300t.

In addition, multiple elongate battery guides (i.e., lower portions 224, 225a and 225b) of support structure 200 of FIG. 2 of this disclosure continue to engage (see FIG. 2) substantially cylindrical side wall 415 of the upper portion 410 of battery (see FIGS. 2A and 6) to continue to guide the power connector 443 of the battery 400 towards engagement with the power connector 344 carried by circuitboard 300t (see FIGS. 1 and 2). Again, this is not possible with the prior art support structure 200 of prior art FIG. 3 since the support structure 200 of FIG. 3 has no multiple elongate battery guides (i.e., lower portions 224, 225a and 225b) to continue to engage the substantially cylindrical side wall 415 of the upper portion 410 of the battery to continue to guide the power connector 443 of power source 400 towards engagement with the power connector 344 carried by circuitboard 300*t*.

Further, in the support structure 200 of FIG. 2 of this disclosure, this engagement between the side wall 415 of the upper portion 410 of the battery (see FIG. 2A) and the multiple elongate battery guides (i.e., lower portions 224, 225*a* and 225*b*) of support structure 220 provides the physical support of the upper portion 410 of the battery 400 within the handle 102 of the scanning device 100. Again, this is not possible with the prior art support structure 200 of prior art FIG. 3 since the support structure 200 of FIG. 3 has no multiple elongate battery guides (i.e., lower portions 224, 225*a* and 225*b*) to provide an engagement with the side wall 415 of the upper portion 410 of the battery to provide the physical support of the upper portion 410 of the battery 400 within the handle 102.

Moreover, the FIG. 3 prior art support structure 200 is without the circuit board supports 221 as taught by this disclosure which supports the circuitboards 300*a*, 300*t* in the assembled scanning device 100.

From this disclosure, the multiple elongate battery guides (i.e., lower portions 224, 225*a* and 225*b*) of support structure 200 of FIG. 2 are seen to provide separate guide rails for the correct positioning of a removable battery (also referred to herein as a "battery pack") inside the handle of a hand held scanning device. The separate guide rails minimize the freedom of movement of the battery within the handle of the hand held scanning device. This creates fewer ways for the handle of the handheld scanning device to accept the battery. The separate guide rails hence provide both mechanical support to the battery and ensure better alignment with the electrical contacts between the battery and a power connector of the scanning device.

The rails provided by the multiple elongate battery guides (i.e., lower portions 224, 225*a* and 225*b*) of support structure 200 have a minimal structure which minimizes the amount of material used to manufacture the support structure 200 to include lower portions 224, 225*a* and 225*b* of this disclosure. This also decreases the total weight of the scanning device. Hence, the support structure 200 of this disclosure provides enhanced mechanical support to a battery and a guide structure for better aligning the electrical contacts of the battery with the electrical contacts of the handheld scanning device.

The rails provided by the multiple elongate battery guides (i.e., lower portions 224, 225*a* and 225*b*) of support structure 200 of this disclosure creates an electrical receptacle for supporting the battery in electrical contact with a power connector of the scanning device. This enables the battery to be easily plugged into the handheld scanning device to deliver immediate charge to and cause operation of the handheld scanning device since the electrical receptacle guides the battery contacts quickly toward and for connection with the electrical contacts of the handheld scanning device.

In addition, the rails provided by the multiple elongate battery guides (i.e., lower portions 224, 225*a* and 225*b*) of support structure 200 of this disclosure may be implemented as a modular and separate structure for mounting into the hand held device body. This means that the support structure 200 of this disclosure need not be delivered as a customized feature or as an integrated component of the handheld scanning device. The modular aspect may allow the support structure 200 of this disclosure to be more easily adapted across a widely varied product line of differing configurations having different physical attributes, as well as different approaches to the provision of electric power and communicating scanned data to other devices.

The support structure 200 of this disclosure further makes it possible to discontinue the prior art practice of prior art FIG. 3 of having the upper portion 410 of the battery 400 physically supported through the power connectors 344 and 443, as well as through circuitboard 300*t*. The support structure 200 of this disclosure frees up the electrical parts of the handheld scanning device (e.g., the electrical connectors and circuit boards) to perform only their electrical functions, without also being required to perform the function of physically supporting the battery.

Turning now to FIGS. 4A, 4B, and 4C, collectively referred to herein as FIG. 4, FIG. 4 depicts aspects of a circuitboard 300*t* of support structure 200 of FIG. 1 of this disclosure. More specifically, FIG. 4 shows positions at which the trigger switch 335 and the power connector 344 are mounted (physically and for electrical connection) to the circuitboard 300*t*.

FIG. 4A shows a frontal view along the width of circuitboard 300*t* wherein trigger switch 335 is attached to the circuitboard 300*t* on a frontal width portion of the circuitboard 300*t*. This allows the outwardly facing trigger switch 335 to extend through an opening near the upper part of the gripping portion of the handle 102 (see FIG. 1) so as to be activatable by a user as previously explained. Connector 344 is also attached to the circuitboard 300*t* but attached so that the contacts of the connector 344 extend into the opening of the U-shaped circuitboard and facing in a direction that is the opposite direction in which the trigger switch 335 is facing. This arrangement allows the trigger switch to face outwardly toward and through the opening of the handle 102 of the scanning device 100 while allowing the connector 344 to face inwardly toward the battery 400. For this reason, the connector 344 is shown in phantom in FIG. 4A and also in the side view of the circuitboard 300*t* depicted in FIG. 4B. FIG. 4C depicts the circuitboard 300*t* taken along the bottom of the circuitboard 300*t* facing upwards towards the U-shaped opening. See portions 323 and 324 denoted in FIG. 4C for reference. In FIG. 4C, electrical contacts on electrical connector 344 are visible and receive the electrical connector on the battery when the battery 400 is inserted into the handle 102 of the handheld scanning device 100.

Turning to FIG. 5, FIG. 5 depicts aspects of a circuitboard 300*a* of the support structure 200 of FIG. 1 of this disclosure. More specifically, FIG. 5 shows layout of electrical traces of circuitboard 300*a* that form the antenna 339. As shown, the traces may extend along a top portion and along portions 339, 339 to form a U-shaped antenna.

Turning to FIG. 6, FIG. 6 depicts aspects of a power source 400 depicted in FIG. 1. The lower end 422 of a lower portion 420 of battery 400 covers an opening formed through the lower end 122 of the handle 102 when the battery 400 is fully installed within the handle 102. See FIG. 1. Connector 443 of the battery 400 connects with the connector 344 of the csircuitboard 300*t* to enable the battery 400 to deliver power to the handheld scanning device 100 when the battery 400 is inserted into the handle 102 of the handheld scanning device 100.

Turning now to the assembly of the scanning device 100 of this disclosure and with reference back to FIG. 1, as the upper end 411 of battery 400 is inserted through the opening formed in the lower end 122 of the handle 102, the upper end 411 of the battery 400 first encounters and is first guided towards the power connector 344 carried by the circuitboard 300*t* by the lower ends 322 of the lower portions 323 and 324 of the circuitboards 300*a* and 300*t* (see FIG. 2A).

As more of the upper portion 410 of the battery 400 is inserted, the upper end 411 of the battery 400 then encounters and is next guided towards the power connector 344 carried by the circuitboard 300*t* by the lower ends 222 of the multiple elongate battery guides (i.e., lower portions 224, 225*a* and 225*b*) of support structure 200 of this disclosure (see FIG. 2).

The multiple elongate battery guides (i.e., lower portions 224, 225*a* and 225*b*) of support structure 200 continue to engage (see FIG. 2) the substantially cylindrical side wall 415 of the upper portion 410 of the battery (see FIG. 2A) to continue to guide the power connector 443 of power source 400 towards engagement with the power connector 344 carried by circuitboard 300*t* (see FIG. 1).

This engagement between the side wall 415 of the upper portion 410 of the battery (see FIG. 2A) and the multiple elongate battery guides (i.e., lower portions 224, 225*a* and 225*b*) of support structure 220 provides the physical support of the upper portion 410 of the battery 400 within the handle 102.

The lower end 422 of the battery 400 that integrates the latching mechanism 431 engages the portion of the lower end 122 of the casing 100 of the handle 102. The latching mechanism 431 holds the battery 400 in place inside the handle 102 of the handheld scanning device 100 into which the battery 400 is inserted.

Turning now to the operation of the scanning device 100 of this disclosure, with battery 400 assembled in the scanning device 100 according to this disclosure, on power on of the handheld scanner 100, the controller 150 may access the memory unit 153 to retrieve and/or execute one or more of the routines to control various aspects of the operation of the system 1000. In so doing, the controller 150 may be caused to monitor various aspects of the system and/or of others of the components of the system such as the memory unit 153, and the scanning engine 135 of the scanning device 100.

By way of example, the controller 150 may be caused by its execution of a bar code capture routine to await an indication of a manual operation of the trigger switch 335, thereby serving to provide a manually entered command to capture an image of and decode the indicia. In response, the controller 150 may be caused to operate the image sensor 137 to so capture an image of the indicia, and store the captured image within the memory unit 153 as the image data.

Such detection of manual operation of the trigger switch 335 may also trigger the execution of a decoding routine by the controller 150. In executing the decoding routine, the controller 150 may be caused to employ any of a variety of algorithms to analyze the captured image of the indicia in the image data to decode the data that may be encoded within the indicia. The controller 150 may then be further caused to store that data within the memory unit 153 as the decoded data.

Such detection of manual operation of the trigger switch 335 may further trigger the execution of an output routine by the controller 150. In various different embodiments, in executing the output routine, the controller 150 may be caused to operate a transceiver to wirelessly transmit the decoded data to a POS device (and/or to still another device, not shown). Alternatively or additionally, the controller 150 may be caused to transmit the decoded data to a POS device (and/or to still another device, not shown) through a data connector (not show) on the handle 102.

The controller 150 may be coupled to the scanning engine 135 and to the light source 136, and configured to: operate the indicia scanning engine 135 to scan the indicia along a central scanning axis; interpret the scanned indicia to decode data that is encoded within the indicia; and in response to a successful scanning of the indicia and in response to a successful interpretation of the scanned indicia, operate a speaker to emit an audible beep or a light source to emit a beam of light to provide feedback to the user of success in scanning and interpretation of the indicia. If decoding is unsuccessful, a successive image frame captured by the image sensor 137 is selected and the decoding process is repeated until a successful decode is achieved.

There is thus described a battery support including a separator plate configured to separate an interior of a head portion of a casing of a scanning device from an interior of an elongate handle portion of the casing when installed within the casing at a location where a first end of the handle portion connects to the head portion. The separator plate may include multiple mounting supports carried by the separator plate to engage mounting portions of the interior of the head portion to install the separator plate within the casing. The battery support may include multiple elongate battery guides that extend from the handle-side surface of the separator plate and into the interior of the handle portion when the separator plate is installed within the casing. The multiple elongate battery guides may be configured to engage a removable battery as the removable battery is inserted into a second end of the handle portion opposite the first end to guide a mating connector carried by the removable battery towards a battery connector carried by the scanning device. The multiple battery guides continue to engage the removable battery while the battery connector engages the mating connector, the multiple battery guides being configured to prevent exertions of physical stress on the battery connector through the mating connector by the removable battery.

The separator plate may further include a circuit board support that extends from a handle-side surface of the separator plate and into the interior of the handle portion, when the separator plate is installed within the casing, to physically support a circuit board that carries the battery connector to engage the mating connector carried by the removable battery when the removable battery is fully inserted into the handle portion of the casing.

The multiple mounting supports may include multiple eyelets positioned about a periphery of the separator plate and are configured to cooperate with multiple fasteners to engage the mounting portions of the interior of the head portion to install the separator plate within the casing.

The head portion of the casing may include a scanning window formed of transparent material through which an indicia scanning engine of the scanning device optically scans an indicia carried on the surface of a label external to the casing. A head-side surface of the separator plate that is opposite the handle-side surface of the separator plate, and that faces into the interior of the head portion of the casing when the separator plate is installed, may be configured to engage and cooperate with a scanning engine support to mount the indicia scanning engine at a fixed location within the interior of the head portion and in an orientation that enables the indicia scanning engine to optically scan the indicia through the scanning window.

The head portion and the handle portion of the casing may cooperate to give the casing a gun-like shape to enable the scanning device to be used to scan an indicia carried on a surface of a label by pointing the scanning device in a gun-like manner at the label and depressing a trigger button of the scanning device. The circuit board may carry the trigger button at a location that makes the trigger button accessible through an opening formed through a portion of the handle portion.

The handle portion may have a flared shape wherein the second end is of smaller cross-section than the first end, and the handle portion tapers along its length from the larger cross-section of the first end to the smaller cross-section of the second end. Each of the multiple elongate battery guides may taper along its length from a larger cross section where each is connected to the handle-side of the separator plate to a smaller cross section as each extends into the interior of the handle portion.

The tapered shape of each of the multiple elongate battery guides may cooperate with the flared shape of the handle portion to enable assembly of the scanning device to include: supporting the circuit board by the circuit board support of the separator plate to position the battery connector and the trigger button at predetermined locations relative to the handle-side of the separator plate; inserting the multiple elongate battery guides into the interior of the handle portion through the first end of the handle portion with the circuit board supported by the circuit board support to position the trigger button to be accessible through the opening and to position the battery connector to be engaged by the mating connector when the removable battery is inserted into the interior of the handle portion; and positioning the multiple mounting supports of the separator plate in engagement with the mounting portions of the interior of the head portion to install the separator plate within the casing.

The second end of the handle portion may carry a retaining mechanism to engage a mating mechanism carried by the removable battery to releasably retain at least a portion of the removable battery within the interior of the handle portion. The removable battery may have an elongate shape that defines a connector end that carries the mating connector and a retaining end that carries the mating mechanism. The multiple elongate battery guides may include at least three elongate battery guides that surround and engage side portions of the removable battery at locations between the connector end and the retaining end.

The circuit board may include at least one elongate portion that extends away from the separator plate and the battery connector and into interior of the handle portion to engage a side portion of the removable battery. As the connector end of the removable battery is inserted into the second end of the handle portion of the casing during insertion of the removable battery into the handle portion to provide electric power to the scanning device, the connector end may be initially engaged by the at least one elongate portion of the circuit board to guide the connector end toward engagement with the multiple elongate battery guides. As the connector end of the removable battery is further inserted into the interior of the handle portion, the connector end may be subsequently engaged by the multiple battery guides to guide the mating connector carried by the connector end toward engagement with the battery connector.

The mating connector at the connector end of the removable battery may engage the battery connector carried by the circuit board, a portion of each of the multiple elongate battery guides engages a portion of the connector end of the battery, and the mating mechanism at the retaining end engages the retaining mechanism at the second end of the handle portion to releasably retain at least a portion of the removable battery within the handle portion.

With the removable battery retained within the interior of the handle portion by cooperation of the retaining mechanism and the mating mechanism, the removable battery may be physically supported within the interior of the handle portion at the retaining end by the engagement between the retaining mechanism, and the mating mechanism, and at the connector end by the multiple elongate battery guides, to prevent damage to the battery connector and the mating connector by preventing transmission of physical forces caused by a dropping of the scanning device onto a hard surface through the engagement the battery connector and the mating connector.

With the removable battery retained within the interior of the handle portion, at least a portion of the retaining end of the removable battery may close the second end of the handle portion and becomes part of the exterior of the casing.

A scanning device may include a casing, an indicia scanning engine, and a battery support. The casing may include a head portion and a handle portion. An interior of the handle portion may be configured to releasably retain a removable battery to provide electric power to the scanning device. The indicia scanning engine may be carried within an interior of the head portion to scan an indicia carried on a surface of a label. The battery support may include a separator plate configured to separate the interior of a head portion from an interior of the handle portion when installed within the casing at a location where a first end of the handle portion connects to the head portion. Multiple elongate battery guides may extend from a handle-side surface of the separator plate and into the interior of the handle portion when the separated plate is installed within the casing. The multiple elongate battery guides may engage a removable battery as the removable battery is inserted into a second end of the handle portion opposite the first end to guide a mating connector of the removable battery towards engagement with a battery connector of the scanning device within the interior of the handle portion. The multiple battery guides may continue to engage the removable battery while the battery connector engages the mating connector, the multiple battery guides configured to prevent exertions of physical stress on the battery connector through the mating connector by the removable battery.

The separator may include multiple eyelets positioned about a periphery of the separator plate and through which fasteners may be inserted to cooperate with mounting portions of the interior of the head portion to install the separator plate within the casing.

The head portion of the casing may include a scanning window formed of transparent material through which the indicia scanning engine optically scans the indicia on the surface of the label. A head-side surface of the separator plate that is opposite the handle-side surface of the separator plate, and that faces into the interior of the head portion of the casing when the separator plate is installed, may be configured to engage and cooperate with a scanning engine support to mount the indicia scanning engine at a fixed location within the interior of the head portion and in an orientation that enables the indicia scanning engine to optically scan the indicia through the scanning window.

The separator plate may include a circuit board support that extends from the handle-side surface of the separator plate and into the interior of the handle portion, when the separator plate is installed within the casing, to physically support a circuit board that carries the battery connector to engage the mating connector carried by the removable battery when the removable battery is fully inserted into the handle portion of the casing.

The head portion and the handle portion of the casing may cooperate to give the casing a gun-like shape to enable the scanning device to be used to scan the indicia on the surface of the label by pointing the scanning device in a gun-like manner at the label and depressing a trigger button of the scanning device. The circuit board may carry the trigger button at a location that makes the trigger button accessible through an opening formed through a portion of the handle portion.

The handle portion may have a flared shape wherein the second end is of smaller cross-section than the first end, and the handle portion tapers along its length from the larger cross-section of the first end to the smaller cross-section of the second end. Each of the multiple elongate battery guides may taper along its length from a larger cross section where each is connected to the handle-side of the separator plate to a smaller cross section as each extends into the interior of the handle portion.

The tapered shape of each of the multiple elongate battery guides may cooperate with the flared shape of the handle portion to enable assembly of the scanning device to include: supporting the circuit board by the circuit board support of the separator plate to position the battery connector and the trigger button at predetermined locations relative to the handle-side of the separator plate; inserting the multiple elongate battery guides into the interior of the handle portion through the first end of the handle portion with the circuit board supported by the circuit board support to position the trigger button to be accessible through the opening and to position the battery connector to be engaged by the mating connector when the removable battery is inserted into the interior of the handle portion; and positioning the multiple mounting supports of the separator plate in engagement with mounting portions of the interior of the head portion to install the separator plate within the casing.

The second end of the handle portion may carry a retaining mechanism to engage a mating mechanism carried by the removable battery to releasably retain at least a portion of the removable battery within the interior of the handle portion. The removable battery may have an elongate shape that defines a connector end that carries the mating connector and a retaining end that carries the mating mechanism. The multiple elongate battery guides may include at least three elongate battery guides that surround and engage side portions the removable battery at locations between the connector end and the retaining end.

The scanning device may include a circuit board that carries the battery connector to engage the mating connector carried by the removable battery when the removable battery is fully inserted into the handle portion of the casing. The circuit board may include at least one elongate portion that extends away from the separator plate and the battery connector and into interior of the handle portion to engage a side portion of the removable battery. As the connector end of the removable battery is inserted into the second end of the handle portion of the casing during insertion of the removable battery into the handle portion to provide electric power to the scanning device, the connector end may be initially engaged by the at least one elongate portion of the circuit board to guide the connector end toward engagement with the multiple elongate battery guides. As the connector end of the removable battery is further inserted into the interior of the handle portion, the connector end may be subsequently engaged by the multiple battery guides to guide the mating connector carried by the connector end toward engagement with the battery connector.

The elongate portion of the circuit board may include at least one conductor that forms an antenna for radio frequency (RF) communications. The scanning device may include a transmitter circuit carried by the circuit board. The transmitter may be configured to transmit data encoded in the indicia after scanning and interpretation of the indicia to decode the encoded data.

As the mating connector at the connector end of the removable battery engages the battery connector carried by the circuit board, a portion of each of the multiple elongate battery guides may engage a portion of the connector end of the battery, and the mating mechanism at the retaining end engages the retaining mechanism at the second end of the handle portion to releasably retain at least a portion of the removable battery within the handle portion.

With the removable battery retained within the interior of the handle portion by cooperation of the retaining mechanism and the mating mechanism, the removable battery may be physically supported within the interior of the handle portion at the retaining end by the engagement between the retaining mechanism, and the mating mechanism, and at the connector end by the multiple elongate battery guides, to prevent damage to the battery connector and the mating connector by preventing transmission of physical forces caused by a dropping of the scanning device onto a hard surface through the engagement the battery connector and the mating connector.

With the removable battery retained within the interior of the handle portion, at least a portion of the retaining end of the removable battery may close the second end of the handle portion and becomes part of the exterior of the casing.

Various other components may be included and called upon for providing for aspects of the teachings herein. For example, additional materials, combinations of materials, and/or omission of materials may be used to provide for added embodiments that are within the scope of the teachings herein.

Standards for performance, selection of materials, functionality, and other discretionary aspects are to be determined by a user, designer, manufacturer, or other similarly interested party. Any standards expressed herein are merely illustrative and are not limiting of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to illustrative embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A battery support comprising:
a separator plate having:
a top surface and a bottom surface configured to separate an interior of a head portion of a casing of a scanning device from an interior of an elongate handle portion of the casing when installed within the casing at a location where a first end of the handle portion connects to the head portion; and
multiple elongate battery guides that extend from the bottom surface of the separator plate and into the interior of the handle portion when the separator plate is installed within the casing, wherein:
the multiple elongate battery guides are configured to receive and engage a removable battery as the removable battery is inserted into a second end of the handle portion opposite the first end to guide a mating connector carried by the removable battery towards a battery connector carried by the scanning device; and
the multiple battery guides continue to engage the removable battery while the battery connector engages the mating connector, the multiple battery guides configured to prevent exertions of physical stress on the battery connector through the mating connector by the removable battery; and
multiple mounting supports carried by the separator plate to engage mounting portions of the interior of the head portion of the casing to install the separator plate within the casing including insertion of the multiple elongate battery guides into the interior or the handle portion.

2. The battery support of claim 1, wherein the multiple mounting supports comprise multiple eyelets positioned about a periphery of the separator plate and are configured to cooperate with multiple fasteners to engage the mounting portions of the interior of the head portion to install the separator plate within the casing.

3. The battery support of claim 2, wherein:
the head portion of the casing comprises a scanning window formed of transparent material through which an indicia scanning engine of the scanning device optically scans an indicia carried on the surface of a label external to the casing; and
the top surface faces the interior of the head portion of the casing when the separator plate is installed, and is configured to engage and cooperate with a scanning engine support to mount the indicia scanning engine at a fixed location within the interior of the head portion and in an orientation that enables the indicia scanning engine to optically scan the indicia through the scanning window.

4. The battery support of claim 1, wherein the separator plate further comprises a circuit board support that extends from the bottom surface of the separator plate and into the interior of the handle portion, when the separator plate is installed within the casing, to physically support a circuit board that carries the battery connector to engage the mating connector carried by the removable battery when the removable battery is fully inserted into the handle portion of the casing.

5. The battery support of claim 4, wherein:
the head portion and the handle portion of the casing cooperate to give the casing a gun-like shape to enable the scanning device to be used to scan an indicia carried on a surface of a label by pointing the scanning device in a gun-like manner at the label and depressing a trigger button of the scanning device; and
the circuit board carries the trigger button at a location that makes the trigger button accessible through an opening formed through a portion of the handle portion.

6. The battery support of claim 5, wherein:
the handle portion has a flared shape wherein the second end is of smaller cross-section than the first end, and the handle portion tapers along its length from the larger cross-section of the first end to the smaller cross-section of the second end; and
each of the multiple elongate battery guides tapers along its length from a larger cross section where each is connected to the bottom surface of the separator plate to a smaller cross section as each extends into the interior of the handle portion.

7. The battery support of claim 6, wherein the tapered shape of each of the multiple elongate battery guides cooperates with the flared shape of the handle portion to enable assembly of the scanning device to comprise:
supporting the circuit board with the circuit board support of the separator plate to position the battery connector and the trigger button at predetermined locations relative to the bottom surface of the separator plate;
inserting the multiple elongate battery guides into the interior of the handle portion through the first end of the handle portion with the circuit board supported by the circuit board support to position the trigger button to be accessible through the opening and to position the battery connector to be engaged by the mating connector when the removable battery is inserted into the interior of the handle portion; and
positioning the multiple mounting supports of the separator plate in engagement with the mounting portions of the interior of the head portion to install the separator plate within the casing.

8. The battery support of claim 2, wherein:
the second end of the handle portion carries a retaining mechanism to engage a mating mechanism carried by the removable battery to releasably retain at least a portion of the removable battery within the interior of the handle portion;
the removable battery has an elongate shape that defines a connector end that carries the mating connector and a retaining end that carries the mating mechanism; and
the multiple elongate battery guides comprises at least three elongate battery guides that surround and engage side portions of the removable battery at locations between the connector end and the retaining end.

9. The battery support of claim 8, wherein:
the circuit board comprises at least one elongate portion that extends away from the separator plate and the battery connector and into interior of the handle portion to engage a side portion of the removable battery;
as the connector end of the removable battery is inserted into the second end of the handle portion of the casing during insertion of the removable battery into the handle portion to provide electric power to the scanning device, the connector end is initially engaged by the at least one elongate portion of the circuit board to guide the connector end toward engagement with the multiple elongate battery guides; and
as the connector end of the removable battery is further inserted into the interior of the handle portion, the connector end is subsequently engaged by the multiple battery guides to guide the mating connector carried by the connector end toward engagement with the battery connector.

10. The battery support of claim 9, wherein, as the mating connector at the connector end of the removable battery engages the battery connector carried by the circuit board, a portion of each of the multiple elongate battery guides engages a portion of the connector end of the battery, and the mating mechanism at the retaining end engages the retaining mechanism at the second end of the handle portion to releasably retain at least a portion of the removable battery within the handle portion.

11. The battery support of claim 10, wherein, with the removable battery retained within the interior of the handle portion by cooperation of the retaining mechanism and the mating mechanism, the removable battery is physically supported within the interior of the handle portion at the retaining end by the engagement between the retaining mechanism, and the mating mechanism, and at the connector end by the multiple elongate battery guides, to prevent damage to the battery connector and the mating connector by preventing transmission of physical forces caused by a dropping of the scanning device onto a hard surface through the engagement the battery connector and the mating connector.

12. The battery support of claim 10, wherein, with the removable battery retained within the interior of the handle portion, at least a portion of the retaining end of the removable battery closes the second end of the handle portion and becomes part of the exterior of the casing.

13. A scanning device comprising:
a casing comprising a head portion and a handle portion, wherein an interior of the handle portion is configured to releasably retain a removable battery to provide electric power to the scanning device;
an indicia scanning engine carried within an interior of the head portion to scan an indicia carried on a surface of a label; and
a battery support formed as a separate structure from the casing, the battery support comprising:
a separator plate having, a top surface and a bottom surface and configured to separate the interior of a head portion from an interior of the handle portion when installed within the casing at a location where a first end of the handle portion connects to the head portion; and
multiple elongate battery guides that extend from the bottom surface of the separator plate and into the interior of the handle portion when the separated plate is installed within the casing, wherein:
the multiple elongate battery guides engage a removable battery as the removable battery is inserted into a second end of the handle portion opposite the first end to guide a mating connector of the removable battery towards engagement with a battery connector of the scanning device within the interior of the handle portion; and
the multiple battery guides continue to engage the removable battery while the battery connector engages the mating connector, the multiple battery guides configured to prevent exertions of physical stress on the battery connector through the mating connector by the removable battery.

14. The scanning device of claim 13, wherein the separator plate comprises multiple eyelets positioned about a periphery of the separator plate and through which fasteners may be inserted to cooperate with mounting portions of the interior of the head portion to install the separator plate within the casing.

15. The scanning device of claim 14, wherein:
the head portion of the casing comprises a scanning window formed of transparent material through which the indicia scanning engine optically scans the indicia on the surface of the label; and
the top surface of the separator plate faces into the interior of the head portion of the casing when the separator plate is installed, and, is configured to engage and cooperate with a scanning engine support to mount the indicia scanning engine at a fixed location within the interior of the head portion and in an orientation that enables the indicia scanning engine to optically scan the indicia through the scanning window.

16. The scanning device of claim 13, wherein the separator plate comprises a circuit board support that extends from the bottom surface of the separator plate and into the interior of the handle portion, when the separator plate is installed within the casing, to physically support a circuit board that carries the battery connector to engage the mating connector carried by the removable battery when the removable battery is fully inserted into the handle portion of the casing.

17. The scanning device of claim 16, wherein:
the head portion and the handle portion of the casing cooperate to give the casing a gun-like shape to enable the scanning device to be used to scan the indicia on the surface of the label by pointing the scanning device in a gun-like manner at, the label and depressing a trigger button of the scanning device; and
the circuit board carries the trigger button at a location that makes the trigger button accessible through an opening formed through a portion of the handle portion.

18. The scanning device of claim 17, wherein:
the handle portion has a flared shape wherein the second end is of smaller cross-section than the first end, and the handle portion tapers along its length from the larger cross-section of the first end to the smaller cross-section of the second end; and
each of the multiple elongate battery guides tapers along its length from a larger cross section where each is connected to the bottom surface of the separator plate to a smaller cross section as each extends into the interior of the handle portion.

19. The scanning device of claim 18, wherein the tapered shape of each of the multiple elongate battery guides cooperates with the flared shape of the handle portion to enable assembly of the scanning device to comprise:
supporting the circuit board with the circuit board support of the separator plate to position the battery connector and the trigger button at predetermined locations relative to the bottom surface of the separator plate;
inserting the multiple elongate battery guides into the interior of the handle portion through the first end of the handle portion with the circuit board supported by the circuit board support to position the trigger button to be accessible through the opening and to position the battery connector to be engaged by the mating connector when the removable battery is inserted into the interior of the handle portion; and
positioning the multiple mounting supports of the separator plate in engagement with mounting portions of the interior of the head portion to install the separator plate within the casing.

20. The scanning device of claim 13, wherein:
the second end of the handle portion carries a retaining mechanism to engage a mating mechanism carried by the removable battery to releasably retain at least a portion of the removable battery within the interior of the handle portion;

the removable battery has an elongate shape that defines a connector end that carries the mating connector and a retaining end that carries the mating mechanism; and the multiple elongate battery guides comprises at least three elongate battery guides that surround and engage side portions the removable battery at locations between the connector end and the retaining end.

21. The battery support of claim 20, wherein:

the scanning device comprises a circuit board that carries the battery connector to engage the mating connector carried by the removable battery when the removable battery is fully inserted into the handle portion of the casing;

the circuit board comprises at least one elongate portion that extends away from the separator plate and the battery connector and into interior of the handle portion to engage a side portion of the removable battery;

as the connector end of the removable battery is inserted into the second end of the handle portion of the casing during insertion of the removable battery into the handle portion to provide electric power to the scanning device, the connector end is initially engaged by the at least one elongate portion of the circuit board to guide the connector end toward engagement with the multiple elongate battery guides; and as the connector end of the removable battery is further inserted into the interior of the handle portion, the connector end is subsequently engaged by the multiple battery guides to guide the mating connector carried by the connector end toward engagement with the battery connector.

22. The scanning device of claim 21, wherein:

the elongate portion of the circuit board comprises at least one conductor that forms an antenna for radio frequency (RE) communications;

the scanning device comprises a transmitter circuit carried by the circuit board; and the transmitter is configured to transmit data encoded in the indicia after scanning and interpretation of the indicia to decode the encoded data.

23. The scanning device of claim 21, wherein, as the mating connector at the connector end of the removable battery engages the battery connector carried by the circuit board, a portion of each of the multiple elongate battery guides engages a portion of the connector end of the battery, and the mating mechanism at the retaining end engages the retaining mechanism at the second end of the handle portion to releasably retain at least a portion of the removable battery within the handle portion.

24. The scanning device of claim 23, wherein, with the removable battery retained within the interior of the handle portion by cooperation of the retaining mechanism and the mating mechanism, the removable battery is physically supported within the interior of the handle portion at the retaining end by the engagement between the retaining mechanism, and the mating mechanism, and at the connector end by the multiple elongate battery guides, to prevent damage to the battery connector and the mating connector by preventing transmission of physical forces caused by a dropping of the scanning device onto a hard surface through the engagement the battery connector and the mating connector.

25. The scanning device of claim 23, wherein, with the removable battery retained within the interior of the handle portion, at least a portion of the retaining end of the removable battery closes the second end of the handle portion and becomes part of the exterior of the casing.

* * * * *